(12) United States Patent
Chung et al.

(10) Patent No.: US 12,166,013 B2
(45) Date of Patent: Dec. 10, 2024

(54) SEMICONDUCTOR PACKAGE, AND A PACKAGE ON PACKAGE TYPE SEMICONDUCTOR PACKAGE HAVING THE SAME

(71) Applicant: SAMSUNG ELECTRONICS CO., LTD., Suwon-si (KR)

(72) Inventors: Hyunsoo Chung, Hwaseong-si (KR); Younglyong Kim, Anyang-si (KR); Myungkee Chung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 348 days.

(21) Appl. No.: 17/578,621

(22) Filed: Jan. 19, 2022

(65) Prior Publication Data

US 2022/0359469 A1 Nov. 10, 2022

(30) Foreign Application Priority Data

May 6, 2021 (KR) .................. 10-2021-0058787

(51) Int. Cl.
| | |
|---|---|
| *H01L 25/065* | (2023.01) |
| *H01L 23/00* | (2006.01) |
| *H01L 23/31* | (2006.01) |
| *H01L 23/538* | (2006.01) |
| *H01L 25/10* | (2006.01) |

(52) U.S. Cl.
CPC ...... *H01L 25/0657* (2013.01); *H01L 23/3128* (2013.01); *H01L 23/5383* (2013.01); *H01L 24/48* (2013.01); *H01L 25/105* (2013.01); *H01L 2224/48228* (2013.01); *H01L 2224/48465* (2013.01); *H01L 2225/0651* (2013.01)

(58) Field of Classification Search
CPC ............... H01L 25/0657; H01L 25/105; H01L 23/5383; H01L 23/3128; H01L 24/48; H01L 2224/48228; H01L 2224/48465; H01L 2225/0651; H10B 80/00
USPC ........................................................ 257/777
See application file for complete search history.

(56) References Cited

U.S. PATENT DOCUMENTS

| | | |
|---|---|---|
| 8,233,303 B2 | 7/2012 | Best et al. |
| 8,659,143 B2 | 2/2014 | Crisp et al. |

(Continued)

*Primary Examiner* — Jasmine J Clark
(74) *Attorney, Agent, or Firm* — F. CHAU & ASSOCIATES, LLC

(57) ABSTRACT

A semiconductor package including: a redistribution layer including redistribution line patterns, redistribution vias connected to the redistribution line patterns, and a redistribution insulating layer surrounding the redistribution line patterns and the redistribution vias; semiconductor chips including at least one upper semiconductor chip disposed on a lowermost semiconductor chip of the semiconductor chips, wherein the at least one upper semiconductor chip is thicker than the lowermost semiconductor chip; bonding wires each having a first end and a second end, wherein the bonding wires connect the semiconductor chips to the redistribution layer, wherein the first end of each of the bonding wires is connected to a respective chip pad of the semiconductor chips and the second end of each of the bonding wires is connected to a respective one of the redistribution line patterns; and a molding member surrounding, on the redistribution layer, the semiconductor chips and the bonding wires.

20 Claims, 15 Drawing Sheets

(56) References Cited

U.S. PATENT DOCUMENTS

| | | |
|---|---|---|
| 10,756,076 B2 | 8/2020 | Kim |
| 10,784,244 B2 | 9/2020 | Han et al. |
| 11,631,660 B2 * | 4/2023 | Lee .................. H01L 21/561 |
| | | 257/777 |
| 2007/0218588 A1 | 9/2007 | Takiar et al. |
| 2015/0021761 A1 | 1/2015 | Park |
| 2016/0086921 A1 * | 3/2016 | Cho .................. H01L 24/06 |
| | | 257/737 |
| 2018/0122789 A1 | 5/2018 | Kang et al. |
| 2019/0067248 A1 | 2/2019 | Yoo et al. |
| 2019/0148349 A1 | 5/2019 | Kim |
| 2020/0219833 A1 | 7/2020 | Lee et al. |
| 2020/0343219 A1 | 10/2020 | Kim et al. |

* cited by examiner

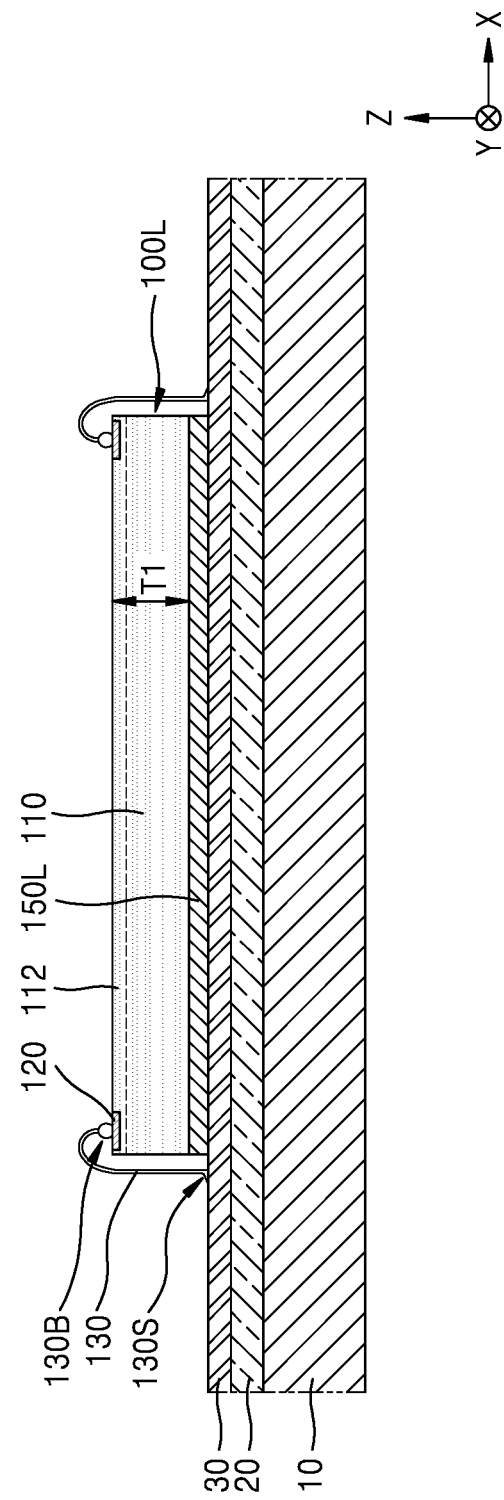

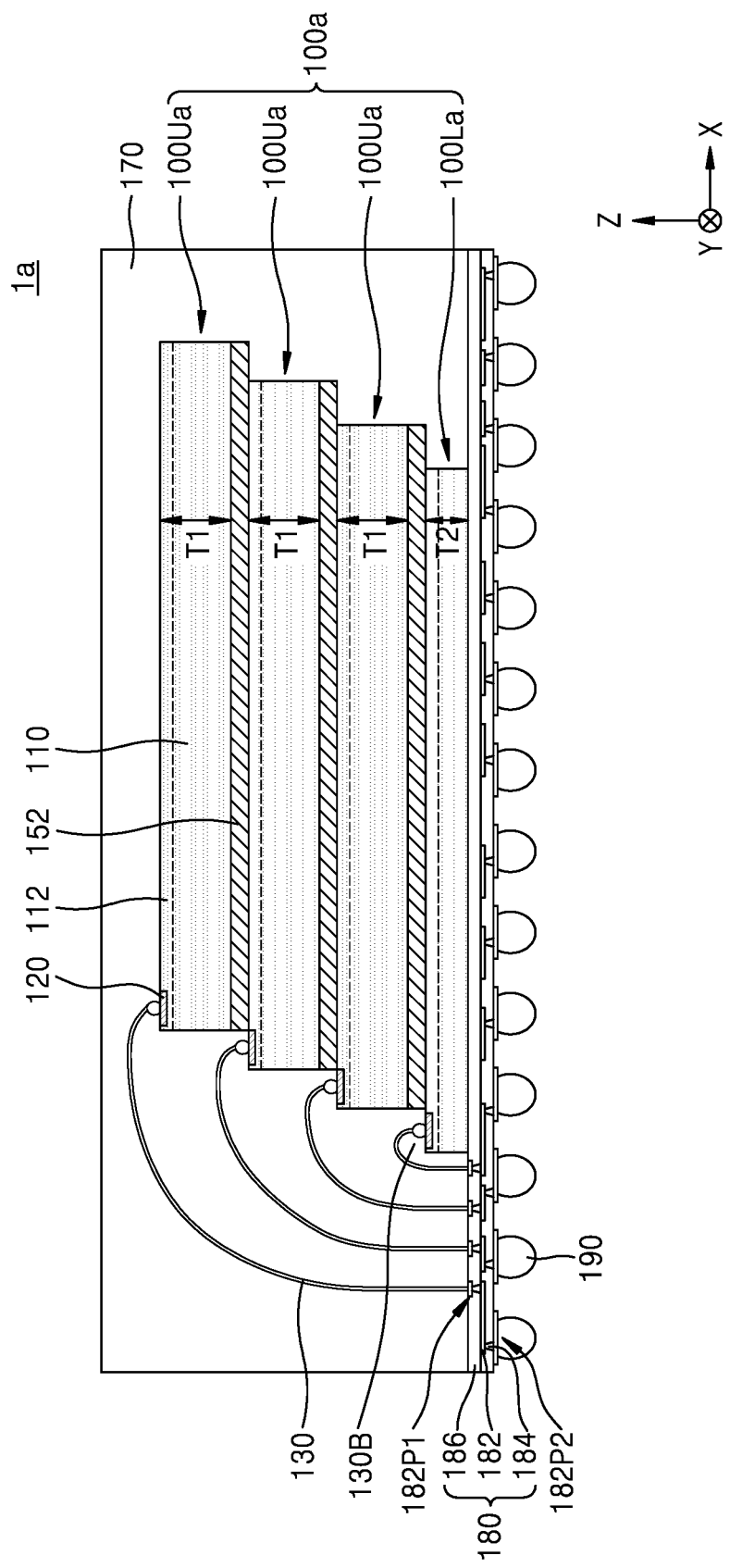

SEMICONDUCTOR PACKAGE, AND A PACKAGE ON PACKAGE TYPE SEMICONDUCTOR PACKAGE HAVING THE SAME

CROSS-REFERENCE TO RELATED APPLICATION

This application claims priority under 35 U.S.C. § 119 to Korean Patent Application No. 10-2021-0058787, filed on May 6, 2021, in the Korean Intellectual Property Office, the disclosure of which is incorporated by reference herein in its entirety.

TECHNICAL FIELD

The inventive concept relates to a semiconductor package, and more particularly, to a semiconductor package including semiconductor chips and a semiconductor package of a package-on-package type including the same.

DISCUSSION OF RELATED ART

As electronic products are becoming more compact and lightweight, semiconductor packages mounted on the electronic products are expected to decrease in volume and include an increasing amount of functions. Accordingly, to provide a multifunctional semiconductor package, a package on package (PoP) type semiconductor package has been developed.

SUMMARY

The inventive concept provides a semiconductor package including semiconductor chips and a semiconductor package of a package on package (PoP) type.

According to an embodiment of the inventive concept, there is provided a semiconductor package including: a redistribution layer including a plurality of redistribution line patterns, a plurality of redistribution vias connected to some of the plurality of redistribution line patterns, and a redistribution insulating layer surrounding some of the plurality of redistribution line patterns and the plurality of redistribution vias; a plurality of semiconductor chips including at least one upper semiconductor chip disposed on a lowermost semiconductor chip of the semiconductor chips, wherein the at least one upper semiconductor chip has a thickness that is greater than a thickness of the lowermost semiconductor chip; a plurality of bonding wires each having a first end and a second end, wherein the plurality of bonding wires connect the plurality of semiconductor chips to the redistribution layer, wherein the first end of each of the plurality of bonding wires is connected to a respective chip pad of the plurality of semiconductor chips and the second end of each of the plurality of bonding wires is connected to a respective one of the plurality of redistribution line patterns; and a molding member surrounding, on the redistribution layer, the plurality of semiconductor chips and the plurality of bonding wires.

According to an embodiment of the inventive concept, there is provided a semiconductor package including: a package board; a sub-semiconductor package and a second semiconductor chip that are disposed on the package board and separated from each other in a horizontal direction, wherein the sub-semiconductor package includes a plurality of first semiconductor chips and a first molding member surrounding the plurality of first semiconductor chips; and a second molding member surrounding, on the package board, the sub-semiconductor package and the second semiconductor chip, wherein the sub-semiconductor package further includes: a redistribution layer including a plurality of redistribution line patterns including a redistribution upper pad and a redistribution lower pad, and a redistribution insulating layer surrounding at least a portion of the plurality of redistribution line patterns; the plurality of first semiconductor chips including a lowermost semiconductor chip that has a lower surface directly contacting an upper surface of the redistribution layer, and at least one upper semiconductor chip stacked on the lowermost semiconductor chip; a plurality of bonding wires connecting a chip pad of the plurality of first semiconductor chips to the redistribution upper pad; and the first molding member surrounding, on the redistribution layer, the plurality of first semiconductor chips and the plurality of bonding wires and contacting the second molding member.

According to an embodiment of the inventive concept, there is provided a package-on-package (PoP) semiconductor package including: a lower package including: a lower package board; a sub-semiconductor package and a second semiconductor chip that are separated from each other on the package board in a horizontal direction, are attached to the lower package board according to a flip chip bonding method, wherein the sub-semiconductor package includes a plurality of first semiconductor chips and a first molding member surrounding the plurality of first semiconductor chips; a second molding member surrounding the sub-semiconductor package and the second semiconductor chip on the package board; and a through via having a lower surface connected to the lower package board by penetrating the second molding member; and an upper package including: an upper package board attached to the lower package and connected to an upper surface of the through via; and at least one upper chip attached to the upper package board, wherein the sub-semiconductor package further includes: a redistribution layer including a plurality of redistribution line patterns including a redistribution upper pad and a redistribution lower pad, and a redistribution insulating layer surrounding a portion of the plurality of redistribution line patterns; the first semiconductor chips including a chip pad on an active surface; a plurality of bonding wires connecting the chip pad of the plurality of first semiconductor chips to the redistribution upper pad; and the first molding member surrounding the plurality of first semiconductor chips and the plurality of bonding wires on the redistribution layer, and a cross-section of the plurality of bonding wires contacting the redistribution upper pad, a lower surface of the first molding member, and a lower surface of a lower first semiconductor chip, which is lowermost among the plurality of first semiconductor chips, form a coplanar surface.

BRIEF DESCRIPTION OF THE DRAWINGS

Embodiments of the inventive concept will be more clearly understood from the following detailed description taken in conjunction with the accompanying drawings in which:

FIGS. 2A, 2B, 2C, 2D, 2E, 2F, 2G, 2H and 2I are cross-sectional views sequentially showing a manufacturing method of a semiconductor package, according to embodiments of the inventive concept;

FIG. 3 is a cross-sectional view of a semiconductor package according to embodiments of the inventive concept;

DETAILED DESCRIPTION OF THE EMBODIMENTS

Figure 1:
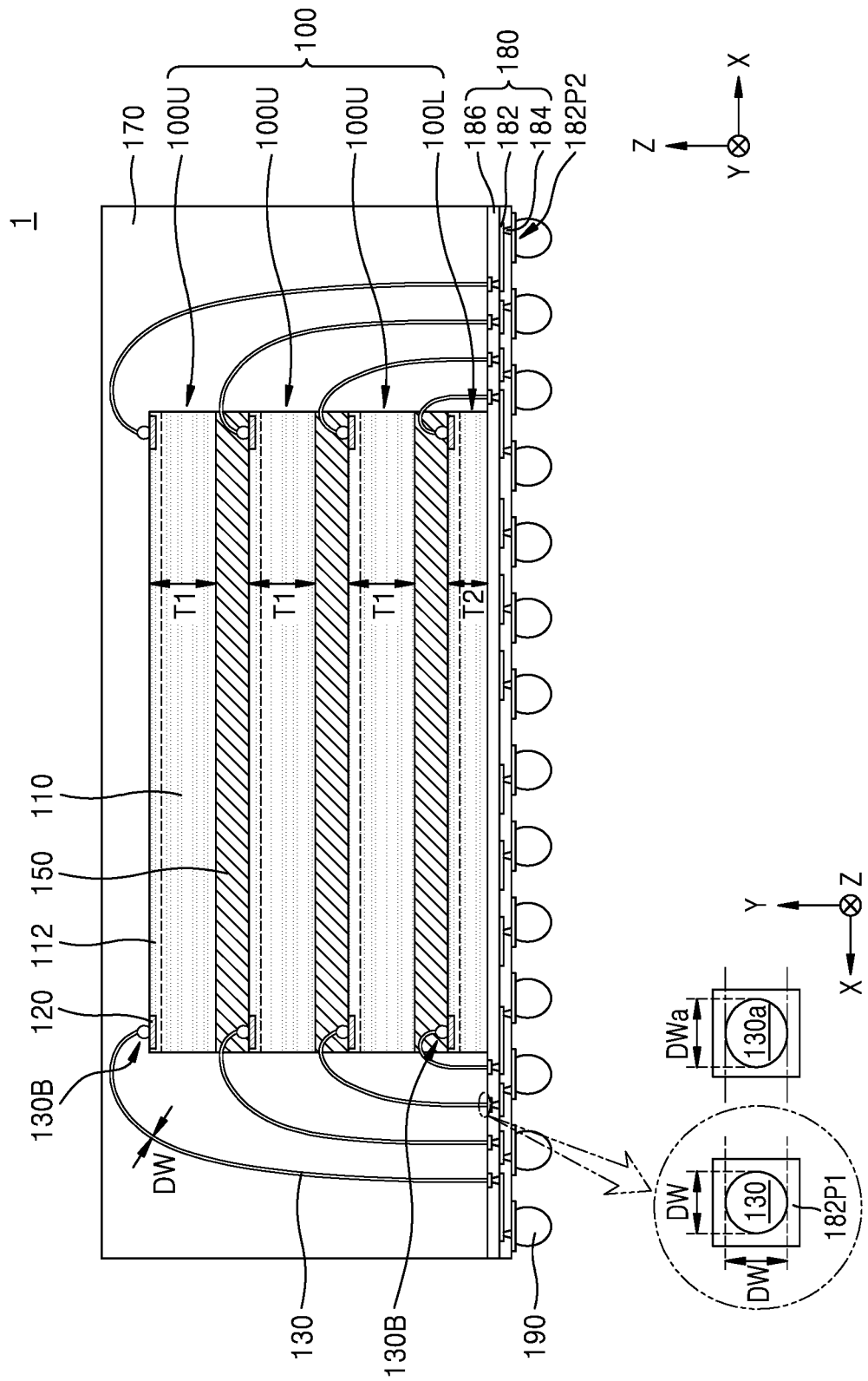
FIG. 1 is a cross-sectional view of a semiconductor package according to embodiments of the inventive concept.

FIG. 1 is a cross-sectional view of a semiconductor package according to embodiments of the inventive concept. For example, FIG. 1 is a cross-sectional view of a semiconductor package and a plane arrangement of a portion of the semiconductor package.

Referring to FIG. 1, a semiconductor package 1 includes a redistribution layer 180 and first semiconductor chips 100 sequentially stacked on the redistribution layer 180. In some embodiments of the inventive concept, the first semiconductor chips 100 may be stacked on the redistribution layer 180 in units of multiples of 4. The semiconductor package 1 may be referred to as a sub-semiconductor package, and the first semiconductor chip 100 may be referred to as a semiconductor chip.

Each of the first semiconductor chips 100 may include a first semiconductor substrate 110 having an active surface and an inactive surface that are opposite to each other, a first semiconductor device 112 formed on the active surface of the first semiconductor substrate 110, and first chip pads 120 arranged on an upper surface of the first semiconductor chip 100. The first chip pad 120 may be referred to as a chip pad. The inactive surface of the first semiconductor substrate 110 may be a lower surface of the first semiconductor chip 100, and wiring lines, wiring vias, and inter-wiring insulating layers surrounding the same may be arranged between the active surface of the first semiconductor substrate 110 and the upper surface of the first semiconductor chip 100.

In some embodiments of the inventive concept, the first chip pads 120 may be edge pads arranged adjacent to edges of an upper surface of each first semiconductor chip 100. For example, the first chip pads 120 may be arranged adjacent to two or four edges among four edges of the upper surface of each first semiconductor chip 100.

Each first semiconductor chip 100 may have a face-up arrangement in which the active surface of the first semiconductor substrate 110 faces upwards. Each first semiconductor chip 100 may have an arrangement in which the inactive surface of the first semiconductor substrate 110 faces the redistribution layer 180, and the first semiconductor chips 100 may be sequentially stacked on the redistribution layer 180.

The first semiconductor substrate 110 may include, for example, a semiconductor material such as silicon (Si) or germanium (Ge). Alternatively, the first semiconductor substrate 110 may include compound semiconductor materials such as silicon carbide (SiC), gallium arsenide (GaAs), indium arsenide (InAs), and indium phosphide (InP). The first semiconductor substrate 110 may include a conductive area, for example, a well doped with impurities. The first semiconductor substrate 110 may have various device isolation structures including a Shallow Trench Isolation (STI) structure.

On the active surface of the first semiconductor substrate 110, the first semiconductor device 112 including various types of individual devices may be formed. The individual devices may include various microelectronic devices, for example, a metal-oxide-semiconductor field effect transistor (MOSFET) such as a complementary metal-oxide-semiconductor (CMOS) transistor, a system large scale integration (LSI), an active element, a passive element, and the like. The individual devices may be electrically connected to the conductive area of the first semiconductor substrate 110. The first semiconductor device 112 may further include wiring lines or wiring vias electrically connecting at least two of the individual devices or the individual devices and the conductive area of the first semiconductor substrate 110 to each other. In addition, the individual devices may be electrically separated from other individual devices that are adjacent to the individual devices by insulating layers, respectively.

In some embodiments of the inventive concept, the first semiconductor device 112 may be a memory semiconductor device, and the first semiconductor chip 100 may be a memory semiconductor chip. For example, the first semiconductor device 112 may be a dynamic random access memory (DRAM) device, and the first semiconductor chip 100 may be a DRAM chip.

The wiring lines and the wiring vias may each include, for example, a metallic material such as aluminum (Al), copper (Cu), or tungsten (W). In some embodiments of the inventive concept, the wiring lines and the wiring vias may each include a wiring barrier layer and a wiring metal layer. The wiring barrier layer may include a metal nitride or an oxide such as titanium (Ti), tantalum (Ta), ruthenium (Ru), manganese (Mn), cobalt (Co), or W or may include an alloy such as Cobalt Tungsten Phosphide (CoWP), Cobalt Tungsten Boron (CoWB), or Cobalt Tungsten Boron Phosphide (CoWBP). The wiring metal layer may include at least one metal selected from W, Al, Ti, Ta, Ru, Mn, and Cu. The first semiconductor chip 100 may include and inter-wiring insulating layer that surrounds the wiring lines and the wiring vias. The inter-wiring insulating layer may include, for example, silicon oxide. In some embodiments of the inventive concept, the inter-wiring insulating layer may include tetraethyl orthosilicate (TEOS). In other embodiments of the inventive concept, the inter-wiring insulating layer may include an insulating material having a lower permittivity than silicon oxide. For example, the inter-wiring insulating layer may include an Ultra-Low k (ULK) layer having an ultra-low dielectric constant K between about 2.2 and about 2.4. The ULK layer may include a SiOC layer or a SiCOH layer.

The first semiconductor chips 100 may include a lower semiconductor chip 100L, which is the closest to a lowermost portion of the semiconductor package 1 that is the redistribution layer 180, and at least one upper semiconductor chip 100U stacked on the lower semiconductor chip 100L. The at least one upper semiconductor chip 100U may have a first thickness T1, and the lower semiconductor chip 100L may have a second thickness T2 that is less than the first thickness T1. In some embodiments of the inventive concept, the first thickness T1 may be greater than the second thickness T2 by as much as about 10 μm to about 70 μm. For example, the first thickness T1 may be between about 80 μm and about 150 μm, and the second thickness T2 may be between about 50 μm and about 80 μm. In another embodiment of the inventive concept, the second thickness T2 may be greater than the first thickness T1.

Other than the lower semiconductor chip 100L having the second thickness T2 that is less than the first thickness T1 of the at least one upper semiconductor chip 100U, the lower semiconductor chip 100L and the at least one upper semiconductor chip 100U may be substantially the same. For example, the lower semiconductor chip 100L may be formed by removing, from the upper semiconductor chip 100U, a portion of the first semiconductor substrate 110 adjacent to the inactive surface of the first semiconductor substrate 110. The lower semiconductor chip 100L may be referred to as the first semiconductor chip 100 that is lowermost among the first semiconductor chips 100. The lower semiconductor chip 100L and the at least one upper semiconductor chip 100U may have the same horizontal width and horizontal area.

The lower semiconductor chip 100L may be attached onto the redistribution layer 180. For example, a lower surface, in other words, the inactive surface, of the lower semiconductor chip 100L may directly contact an upper surface of the redistribution layer 180. The at least one upper semiconductor chip 100U may have a die bonding film 150, which is attached to a lower surface of the at least one upper semiconductor chip 100U, and attached to a structure thereunder. For example, when the first semiconductor chips 100 include one lower semiconductor chip 100L and upper semiconductor chips 100U, the upper semiconductor chip 100U, which is lowermost among the upper semiconductor chips 100U, may be attached onto the lower semiconductor chip 100L with the die attach film 150 therebetween. The rest of the upper semiconductor chips 100U may be attached onto other upper semiconductor chips 100U thereunder with the die attach films 150 therebetween.

In other words, the first semiconductor chips 100 are sequentially stacked with the die attach films 150 therebetween, respectively, and the first semiconductor chip 100, which is lowermost among the first semiconductor chips 100, may be directly attached to the redistribution layer 180. In other words, there may be no die attach film 150 between the lowermost first semiconductor chip 100 and the redistribution layer 180.

The first semiconductor chips 100 may be sequentially stacked on the redistribution layer 180 in a vertical direction (a Z direction). The first semiconductor chips 100 may be stacked to overlap each other in the vertical direction (the Z direction). Respective edges of the first semiconductor chips 100 may be aligned in the vertical direction (a Z direction).

The redistribution layer 180 may include redistribution line patterns 182, redistribution vias 184, and a redistribution insulating layer 186. In some embodiments of the inventive concept, the redistribution insulating layer 186 may be stacked in plural. The redistribution insulating layer 186 may be formed from, for example, a photo imageable dielectric (PID) or photosensitive polyimide (PSPI). The redistribution line patterns 182 and the redistribution vias 184 may each include, for example, a metal such as Cu, Al, W, Ti, Ta, indium (In), molybdenum (Mo), Mn, cobalt (Co), tin (Sn), nickel (Ni), magnesium (Mg), rhenium (Re), beryllium (Be), gallium (Ga), or ruthenium (Ru) or an alloy thereof, but materials of the redistribution line patterns 182 and the redistribution vias 184 are not limited thereto. In some embodiments of the inventive concept, the redistribution line patterns 182 and the redistribution vias 184 may be formed as metal or metal alloys are stacked on a seed layer including Ti, titanium nitride (TiN), or titanium tungsten (TiW).

The redistribution line patterns 182 may be arranged on at least one of an upper surface and a lower surface of the redistribution insulating layer 186. The redistribution vias 184 may respectively contact some of the redistribution line patterns 182 and may be connected thereto by penetrating the redistribution insulating layer 186. In some embodiments of the inventive concept, at least some of the redistribution line patterns 182 may be formed together with some of the redistribution vias 184 and thus integrated. For example, the redistribution line patterns 182 and the redistribution vias 184 contacting the upper surfaces of the redistribution line patterns 182 may be integrally formed.

In some embodiments of the inventive concept, the redistribution vias 184 may each have a tapered shape in which the horizontal width of the redistribution via 184 decreases upwards and extends. In other words, the redistribution vias 184 may have horizontal widths increasing away from the first semiconductor chips 100. For example, a lowermost portion of a redistribution via 184 may be wider than an uppermost portion of the redistribution via 184.

Some of the redistribution line patterns 182 arranged on the upper surface of the redistribution layer 180 may be referred to as redistribution upper pads 182P1, and others of the redistribution line patterns 182 arranged on the lower surface of the redistribution layer 180 may be referred to as redistribution lower pads 182P2. The redistribution upper pads 182P1 may overlap the redistribution lower pads 182P2.

First chip connection terminals 190 may be attached to the redistribution lower pads 182P2, respectively. For example, the first chip connection terminals 190 may be solder balls or micro-bumps. In some embodiments of the inventive concept, the semiconductor package 1 may not include the first chip connection terminals 190, and the redistribution lower pads 182P2 may be exposed to the outside.

Ends of bonding wires 130 may be attached to the first chip pads 120 of the first semiconductor chips 100, and the other ends of the bonding wires 130 may be attached to the redistribution upper pads 182P1. In other words, a first end of a bonding wire 130 may be attached to a first chip pad 120 of one first semiconductor chip 120 and a second end of the bonding wire 130 may be attached to a redistribution upper pad 182P1. Portions of the first semiconductor chips 100, which are adjacent to the ends of the bonding wires 130 attached to the first chip pads 120 except for the uppermost first semiconductor chip 100 and include ball bonds 130B, may be buried in the die bonding films 150. For example, the bonding wires 130 may each include gold (Au) or Cu.

In some embodiments of the inventive concept, the bonding wires 130 may be ball-bonded to the first chip pads 120 of the first semiconductor chips 100, and the bonding wires 130 may have the ball bonds 130B on ends thereof and may be attached to the first chip pads 120.

The bonding wires 130 may approximately have first diameters DW. For example, the bonding wires 130 may have the first diameters DW having uniform values and extend on portions other than the ball bonds 130B. The first diameter DW may be between about 0.5 mil and about 1 mil.

In some embodiments of the inventive concept, the bonding wires 130 may extend from the redistribution upper pads 182P1 in the vertical direction (the Z direction). In some embodiments of the inventive concept, cross-sections of the other ends of the bonding wires 130 contacting the redistribution upper pads 182P1 may each have a circular shape. In other words, interfaces between the redistribution upper pads 182P1 and the bonding wires 130 may have circular shapes. For example, the cross-sections of the other ends of the bonding wires 130 contacting the redistribution upper pads 182P1 may each have a circular shape having the first diameter DW. After the bonding wires 130 have stitch bonds (130S of FIGS. 2C to 2G) on the other ends thereof, the cross-sections of the other ends may have circular shapes by removing portions thereof, which will be described in detail with reference to FIGS. 2C to 2H.

In other embodiments of the inventive concept, the semiconductor package 1 may include bonding wires 130a instead of the bonding wires 130. For example, the bonding wires 130a may extend from the redistribution upper pads 182P1 in a different direction from the vertical direction (the Z direction), for example, at a gradient less than or equal to 5 degrees from the vertical direction (the Z direction). The cross-sections of the other ends of the bonding wires 130a contacting the redistribution upper pads 182P1 may have oval shapes. A short axis of the cross-section of the other end of the bonding wire 130a may have the first diameter DW, and a long axis of the other end of the bonding wire 130a may have a second diameter DWa that is greater than the first diameter DW. The second diameter DWa may have a greater value than the first diameter DW by less than or equal to about 5%. For example, the cross-section of the other end of the bonding wire 130a may have an oval shape close to a circle.

The semiconductor package 1 may include a molding member 170 covering the upper surface of the redistribution layer 180 and surrounding the first semiconductor chips 100 and the bonding wires 130a. The molding member 170 may include, for example, an epoxy mold compound (EMC). In some embodiments of the inventive concept, a horizontal width and a horizontal area of the molding member 170 may be the same as those of the redistribution layer 180. For example, a side surface of the molding member 170 is aligned with a side surface of the redistribution layer 180 in the vertical direction (the Z direction), and thus, form a coplanar surface. The molding member 170 may be referred to as a first molding member.

The lower surface of the molding member 170, the cross-sections of the other ends of the bonding wires 130 contacting the redistribution upper pads 182P1, and the lower surface of the lower semiconductor chip 100L, which is lowermost among the first semiconductor chips 100, may be at the same vertical level. For example, the lower surface of the molding member 170, the cross-sections of the other ends of the bonding wires 130 contacting the redistribution upper pads 182P1, and the lower surface of the lower semiconductor chip 100L, which is lowermost among the first semiconductor chips 100, may form the coplanar surface.

In the semiconductor package 1, because the cross-sections of the other ends of the bonding wires 130 contacting the redistribution upper pads 182P1 have the same first diameter DW as most of the bonding wires 130, the bonding wires 130 connected to the redistribution upper pads 182P1 may perform a micro-pillar function. Therefore, because distances between the other ends of the bonding wires 130 connected to the redistribution upper pads 182P1 are reduced, a bandwidth provided by the semiconductor package 1 may increase.

Therefore, manufacturing costs are reduced by connecting the first semiconductor chips 100 through a wire bonding process, and a horizontal area may decrease and a high bandwidth of the semiconductor package 1 may be provided.

FIGS. 2A to 2I are cross-sectional views sequentially showing a manufacturing method of a semiconductor package, according to embodiments of the inventive concept.

Figure 2A:
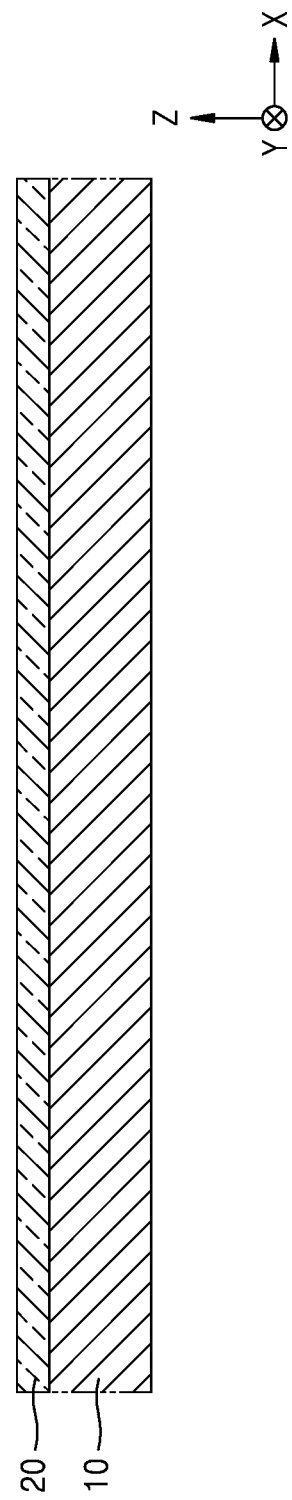

Referring to FIG. 2A, a carrier substrate 10 to which a release layer 20 is attached is prepared.

The carrier substrate 10 may support an organic insulating layer and may include an arbitrary material having stability during a baking process, an etching process, and the like. In addition, when the carrier substrate 10 is separated and removed later through laser ablation, the carrier substrate 10 may be a light-transmissive substrate. In some embodiments of the inventive concept, when the carrier substrate 10 is separated and removed later through heating, the carrier substrate 10 may be a heat-resisting substrate. For example, the carrier substrate 10 may be a glass substrate. In other embodiments of the inventive concept, the carrier substrate 10 may include a heat-resisting organic polymer material such as polyimide (PI), polyetheretherketone (PEEK), poly (ethersulfone) (PES), or poly(phenylene sulfide) (PPS), but the material of the carrier substrate 10 is not limited thereto.

In some embodiments of the inventive concept, the release layer 20 may include a layer reaction layer allowing the separation of the carrier substrate 10 as the release layer 20 is vaporized in reaction to the irradiation of laser beams. The laser reaction layer may be a carbon-based material layer. For example, the laser reaction layer may be a spin-on hard mask (SOH) that is an amorphous carbon layer (ACL) or a layer including a hydrocarbon compound having relatively high carbon content ranging from about 85 wt % to about 99 wt % with respect to its total content or including a derivative thereof.

In other embodiments of the inventive concept, the release layer 20 may further include a protection layer covering the laser reaction layer. The protection layer may prevent the contamination caused by the material diffusion between the laser reaction layer and a material layer added in a subsequent process. In addition, the protection layer may prevent the material layer, which is added in the subsequent process, from being affected by the laser that is irradiated when the carrier substrate 10 is separated.

The protection layer may be a single metal film or a multilayered metal film and may include, for example, a material selected from the group consisting of Cu, Ti, TiW, TiN, Ta, tantalum nitride (TaN), chromium (Cr), and Al. However, the materials of the protection layer are not limited thereto.

Figure 2B:
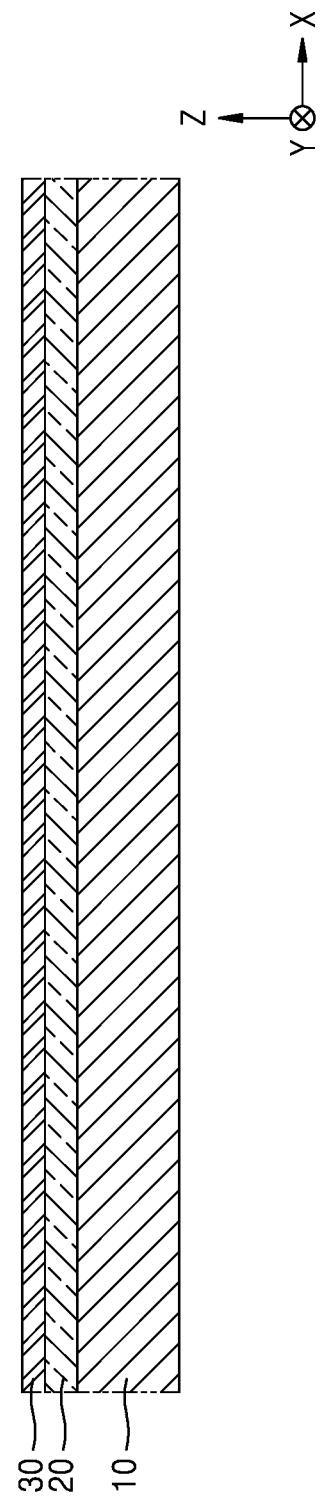

Referring to FIG. 2B, a wire attaching layer 30 is formed on the release layer 20. The wire attaching layer 30 may include, for example, a conductive material. In some embodiments of the inventive concept, the wire attaching layer 30 may be a metal material layer formed according to a physical vapor deposition (PVD) method. For example, the wire attaching layer 30 may include Cu, Ti, Au, or the like according to a sputtering method. In some embodiments of the inventive concept, the wire attaching layer 30 may have a thickness ranging from about 5 μm to about 20 μm, but the thickness thereof is not limited thereto.

Referring to FIG. 2C, the lower semiconductor chips 100L are attached on the wire attaching layer 30. The lower semiconductor chip 100L may have a lower die bonding film 150L on the lower surface of the lower semiconductor chip 100L and may be attached onto the wire attaching layer 30. For example, the lower die bonding film 150L may be in direct contact with the lower surface of the wire attaching layer 30. The lower semiconductor chip 100L may have a first thickness T1.

After the lower semiconductor chip 100L is attached to the wire attaching layer 30, the bonding wires 130 are formed to connect the lower semiconductor chip 100L to the wire attaching layer 30. The ends of the bonding wires 130 may be attached to the first chip pads 120 of the lower semiconductor chip 100L, and the other ends of the bonding wires 130 may be attached to the wire attaching layer 30. For example, a first end of a first bonding wire 130 may be attached to the first chip pad 120 of the lower semiconductor chip 100L, and a second end of the first bonding wire 130 may be attached to the wire attaching layer 30.

In some embodiments of the inventive concept, the bonding wires 130 may be attached to the wire attaching layer 30 to extend therefrom in the vertical direction (the Z direction). In other embodiments of the inventive concept, the bonding wires (130a of FIG. 1) may be attached to the wire attaching layer 30 instead of the bonding wires 130 so that the bonding wires 130a may extend from the wire attaching layer 30 in the vertical direction (the Z direction) at a gradient less than or equal to 5 degrees.

In some embodiments of the inventive concept, the bonding wires 130 may be ball-bonded to the first chip pads 120 of the lower semiconductor chip 100L, may have the ball bonds 130B on the ends of the bonding wires 130 that are attached to the first chip pads 120. The bonding wires 130 may be stitch-bonded to the wire attaching layer 30, may have the stitch bonds 130S on the other ends thereof for attaching to the wire attaching layer 30.

Figure 2D:
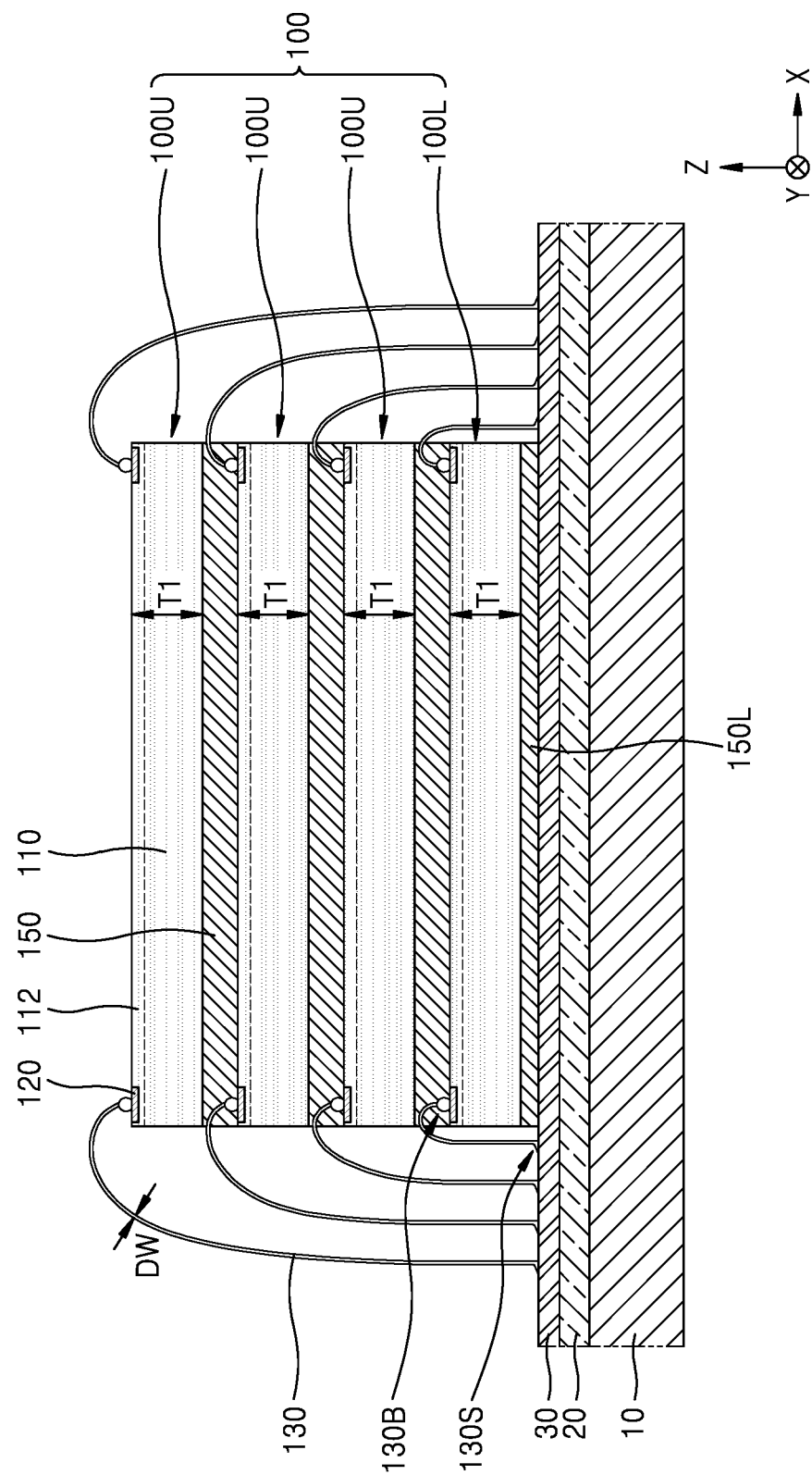

Referring to FIG. 2D, after the upper semiconductor chip 100U, which includes the die bonding film 150 on the lower surface thereof, is attached onto the lower semiconductor chip 100L, the bonding wires 130 connecting the upper semiconductor chip 100U to the wire attaching layer 30 are formed. The ends of the bonding wires 130 may be attached to the first chip pads 120 of the upper semiconductor chip 100U, and the other ends of the bonding wires 130 may be attached to the wire attaching layer 30.

In some embodiments of the inventive concept, the bonding wires 130 may be ball-bonded to the first chip pads 120 of the upper semiconductor chip 100U, may have ball bonds 130B on the ends of the bonding wires 130, and may be attached to the first chip pads 120. The bonding wires 130 may be stitch-bonded to the wire attaching layer 30, have the stitch bonds 130S on the other ends of the bonding wires 130, and may be attached to the wire attaching layer 30.

In some embodiments of the inventive concept, other upper semiconductor chips 100U may be further attached on the upper semiconductor chip 100U. The first semiconductor chips 100 including the lower semiconductor chip 100L and the upper semiconductor chips 100U may be attached on the wire attaching layer 30 by repeatedly performing a process of forming the bonding wires 130 connecting the other upper semiconductor chips 100U to the wire attaching layer 30, thereby forming the bonding wires 130 connecting the first semiconductor chips 100 to the wire attaching layer 30. Most portions of the bonding wires 130 may have first diameters DW. For example, each bonding wire 130 may have the first diameter DW having a constant value throughout the bonding wire 130 except for the ball bonds 130B and the stitch bonds 130S.

A portion including the ball bond 130B and being adjacent to the end of each bonding wire 130 may be buried in the die bonding film 150. In some embodiments of the inventive concept, the die bonding film 150 may be greater in thickness than the lower die bonding film 150L. In other embodiments of the inventive concept, the lower die bonding film 150L may be greater in thickness than the die bonding film 150.

Figure 2E:
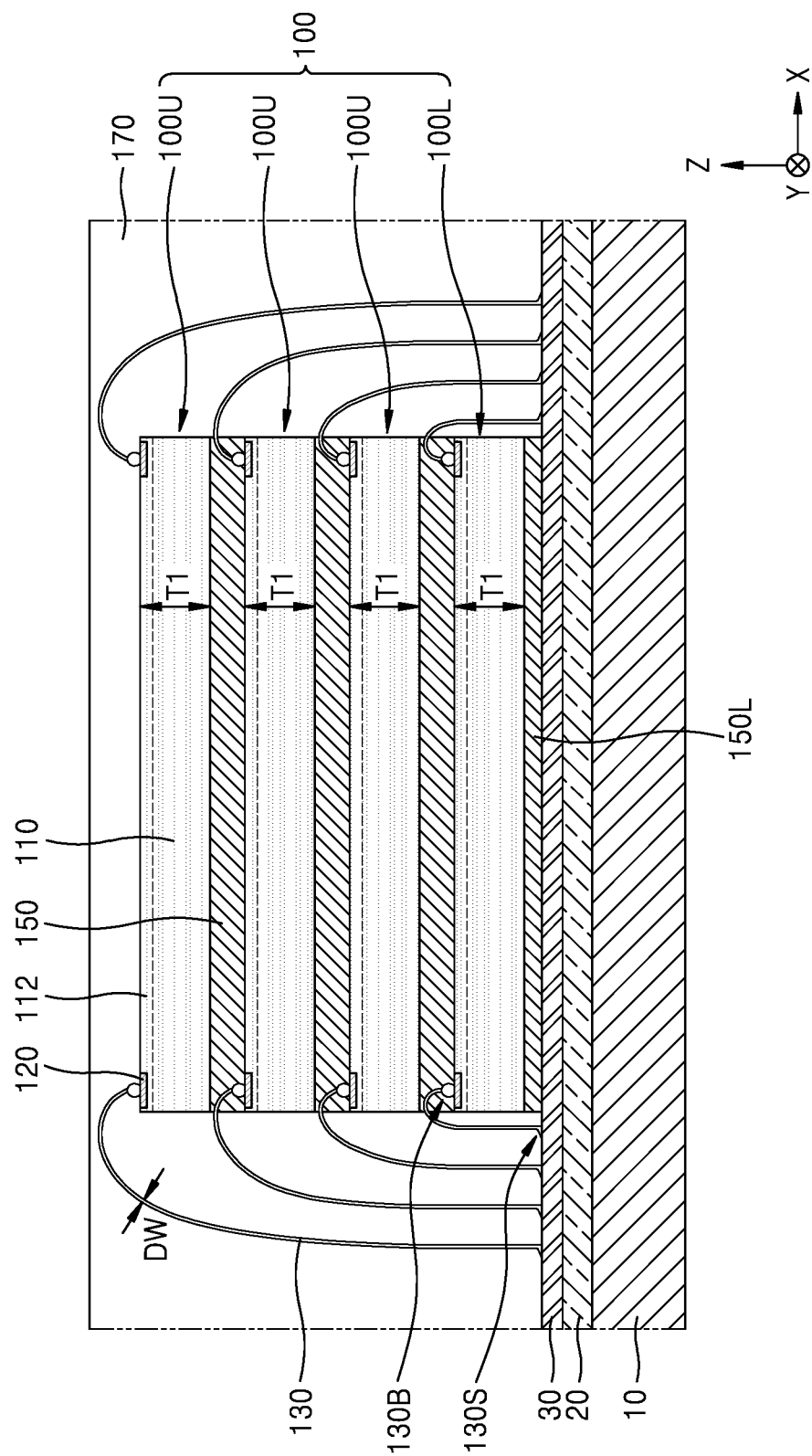

Referring to FIG. 2E, on the wire attaching layer 30, the molding member 170 covering the upper surface of the wire attaching layer 30 and surrounding the first semiconductor chips 100 and the bonding wires 130 is formed. The molding member 170 may have the upper surface at a higher level than uppermost portions of the first semiconductor chips 100 and the bonding wires 130 to cover both the first semiconductor chips 100 and the bonding wires 130.

Figure 2F:
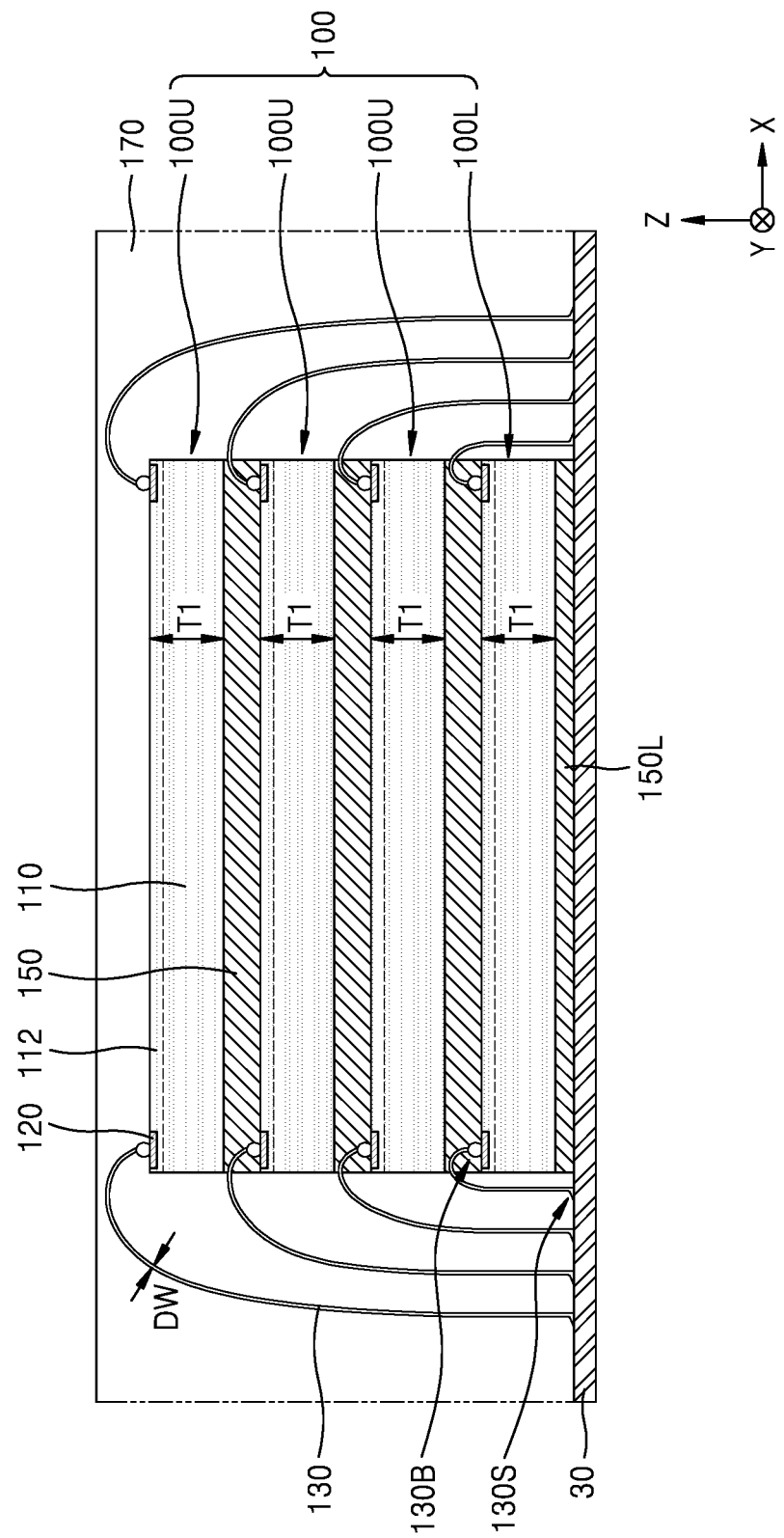

Referring to FIGS. 2E and 2F, the carrier substrate 10 is removed from the wire attaching layer 30. Laser beams may be irradiated onto the carrier substrate 10 to separate and remove the carrier substrate 10. Through the irradiation of the laser beams, adhesion between the release layer 20 and the carrier substrate 10 may decrease. In some embodiments of the inventive concept, at least a portion of the release layer 20 may be removed through the irradiation of the laser beams.

In some embodiments of the inventive concept, portions of the release layer 20 remaining on the lower surface of the wire attaching layer 30 may be removed using an etchant. The portions of the release layer 20 remaining on the lower surface of the wire attaching layer 30 may be removed through wet etching or dry etching.

Figure 2G:
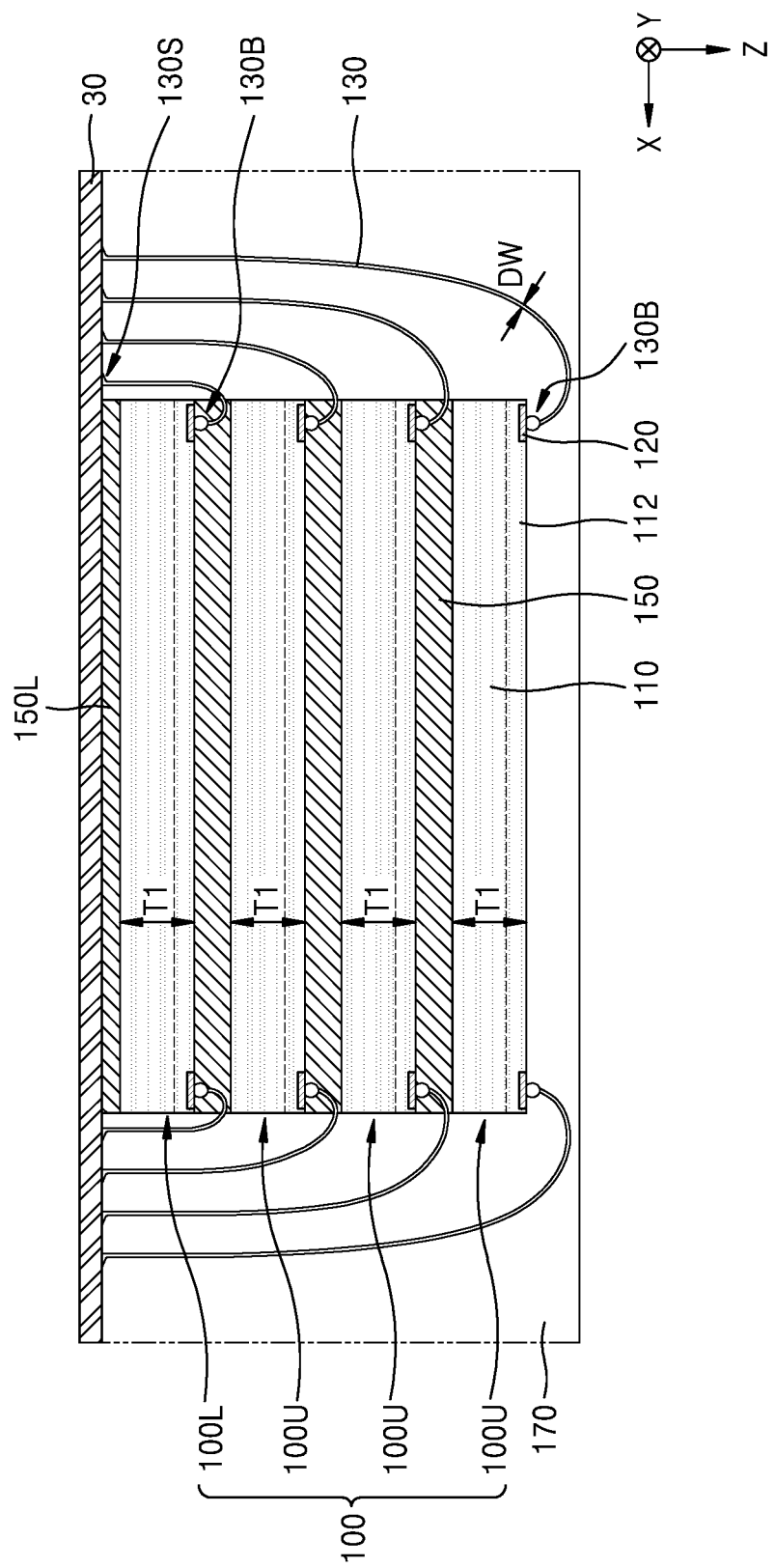

Referring to FIG. 2G, by flipping the result of FIG. 2F upside down, the wire attaching layer 30 faces upwards. In this case, the result of FIG. 2F may be attached to a support substrate to make the upper surface of the molding member 170 face the support substrate.

Figure 2H:
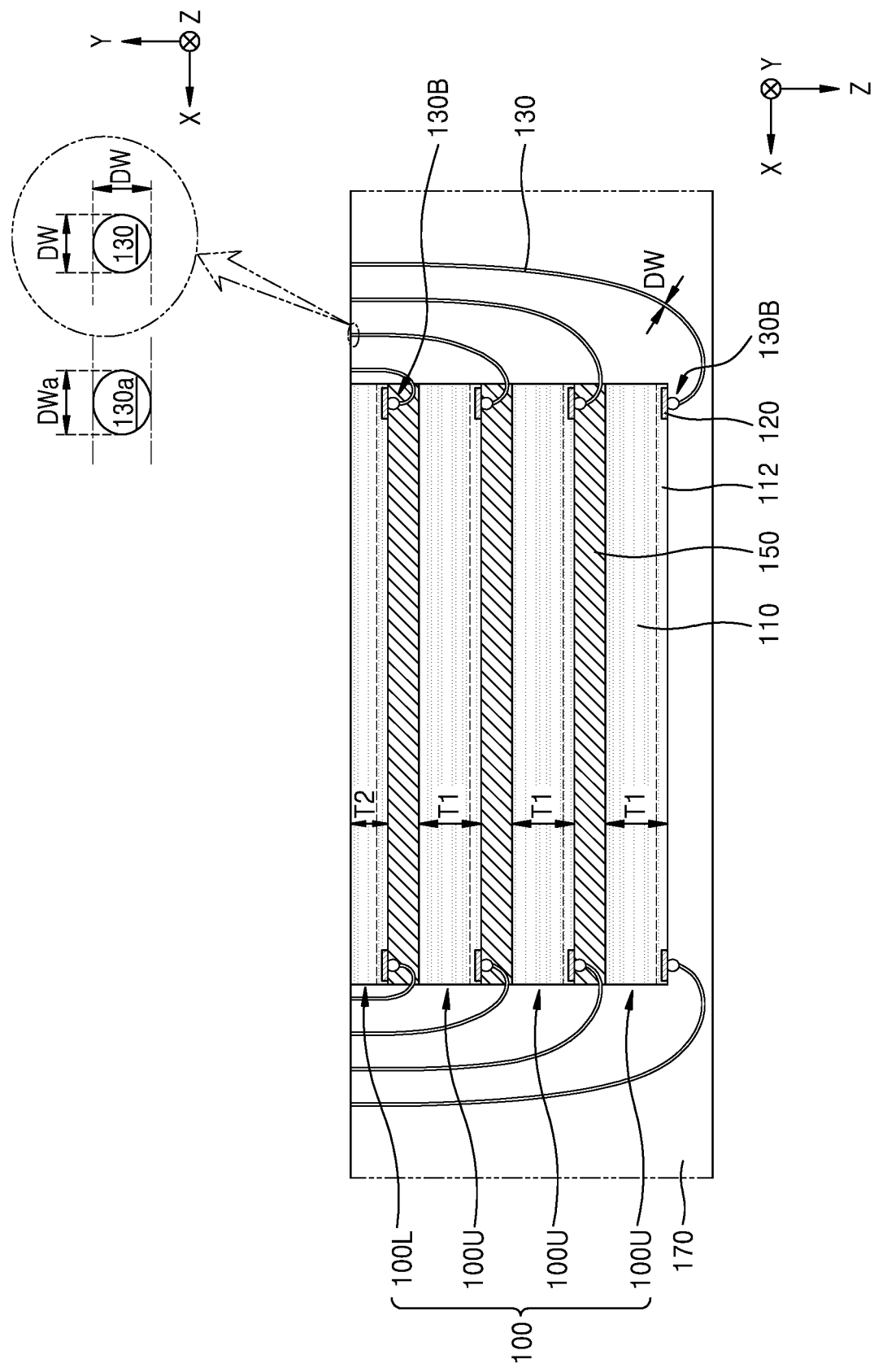

Referring to FIGS. 2G and 2H, by removing the wire attaching layer 30, the molding member 170, the bonding wires 130, and the lower semiconductor chip 100L are exposed. While the wire attaching layer 30 is removed, portions of the molding member 170 adjacent to the wire attaching layer 30, the bonding wires 130, and the lower semiconductor chip 100L may be removed together, respectively. In addition, while the wire attaching layer 30 is removed, the lower die bonding film 150L disposed between the wire attaching layer 30 and the lower semiconductor chip 100L may also be removed.

In some embodiments of the inventive concept, portions of the wire attaching layer 30, the molding member 170 adjacent to the wire attaching layer 30, the bonding wires 130, and the lower semiconductor chip 100L may be respectively removed through a chemical-mechanical polishing (CMP) process. While the wire attaching layer 30 is removed, the stitch bond 130S of each bonding wire 130 and a portion adjacent to the stitch bond 130S may be removed.

As the portions of the molding member 170 adjacent to the wire attaching layer 30, the bonding wires 130, and the lower semiconductor chip 100L are removed, the molding member 170, the bonding wires 130, and the lower semiconductor chip 100L exposed at an upper surface of the result of FIG. 2H may form a coplanar surface along an X-Y plane.

As the portions of the lower semiconductor chip 100L adjacent to the wire attaching layer 30 are removed, the lower semiconductor chip 100L may have the second thickness T1 that is less than the first thickness T1 of the at least one upper semiconductor chip 100U. In some embodiments of the inventive concept, the first thickness T1 may be greater than the second thickness T2 by as much as about 10 μm to about 70 μm. For example, the first thickness T1 may be between about 80 μm and about 150 μm, and the second thickness T2 may be between about 50 μm and about 80 μm.

In some embodiments of the inventive concept, cross-sections of the bonding wires 130 exposed at the upper surface of the result of FIG. 2H may each have a circular shape. For example, the cross-sections of the bonding wires 130 exposed at the upper surface of the result of FIG. 2H may each have a circular shape having the first diameter DW.

In other embodiments of the inventive concept, when the bonding wires 130a are formed instead of the bonding wires 130, cross-sections of the bonding wires 130a exposed at the upper surface of the result of FIG. 2H may each have an oval shape. For example, a short axis of the cross-section of the bonding wire 130a exposed at the upper surface of the result of FIG. 2H may have the first diameter DW, and a long axis thereof may have the second diameter DWa that is greater than the first diameter DW. The second diameter DWa may be greater than the first diameter DW by as much as about 5% or less. For example, the cross-section of the bonding wire 130a exposed at the upper surface of the result of FIG. 2H may have an oval shape close to a circle.

Figure 2I:
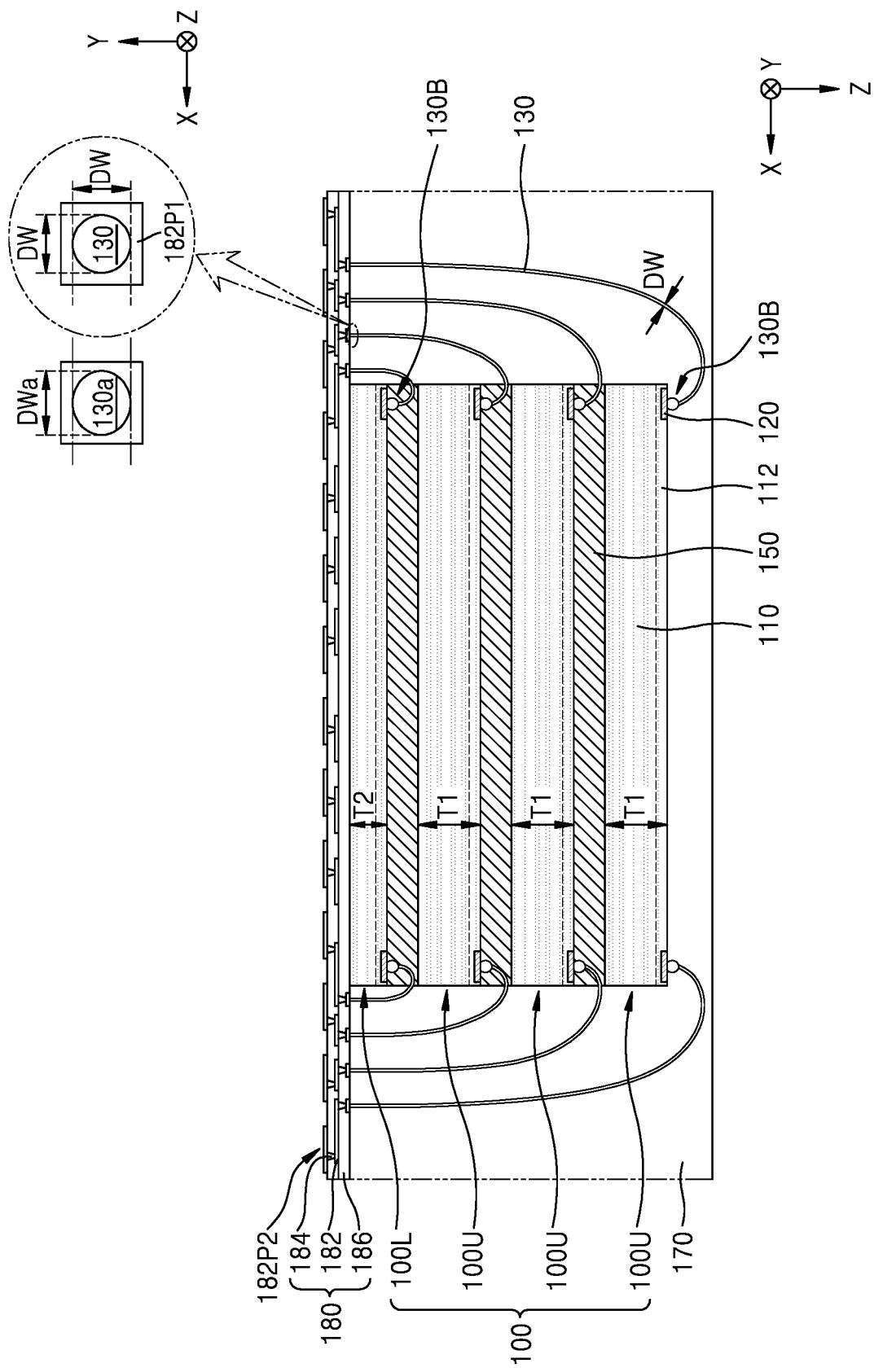

Referring to FIG. 2I, the redistribution layer 180 covering the lower semiconductor chip 100L and the molding member 170 is formed on the upper surface of the result of FIG. 2H.

The redistribution layer 180 may include the redistribution line patterns 182, the redistribution vias 184, and the redistribution insulating layer 186. In some embodiments of the inventive concept, the redistribution insulating layer 186 may be stacked in plural. The redistribution line patterns 182 may be arranged on at least one of the upper surface and the lower surface of the redistribution insulating layer 186. In other words, the redistribution line patterns 182 may be arranged on opposite surfaces of the redistribution insulating layer 186. The redistribution vias 184 may respectively contact some of the redistribution line patterns 182 and may be connected thereto by penetrating the redistribution insulating layer 186. The redistribution insulating layer 186 may surround at least some portions of the redistribution line patterns 182 and the redistribution vias 184.

In some embodiments of the inventive concept, after the redistribution insulating layer 186 including via holes is formed, the redistribution line patterns 182, which cover the redistribution vias 184 filling the via holes and part of the upper surface of the redistribution insulating layer 186 and are connected to the redistribution vias 184, may be formed. For example, at least some of the redistribution line patterns 182 may be integrally formed with some of the redistribution vias 184. For example, the redistribution vias 184 and the redistribution line patterns 182 contacting the redistribution vias 184 on the redistribution vias 184 may be integrally formed.

The redistribution insulating layer 186 may include, for example, PID or PSPI. In some embodiments of the inventive concept, the via holes may have tapered shapes in which horizontal widths of the via holes decrease towards the first semiconductor chips 100.

The redistribution line patterns 182 and the redistribution vias 184 may each include, for example, a metal such as Cu, Al, W, Ti, Ta, In, Mo, Mn, Co, Sn, Ni, Mg, Re, Be, Ca, or Ru, or an alloy thereof, but materials of the redistribution line patterns 182 and the redistribution vias 184 are not limited thereto. In some embodiments of the inventive concept, the redistribution line patterns 182 and the redistribution vias 184 may each be formed as metal or metal alloys are stacked on a seed layer including Ti, TiN, or TiW.

Some of the redistribution line patterns 182 that contact the bonding wires 130 may be referred to as the redistribution upper pads 182P1, and others of the redistribution line patterns 182, which are arranged on the upper surface of the redistribution layer 180, in other words, a surface of the redistribution layer 180 away from the first semiconductor chips 100 in the result of FIG. 2I, may be referred to as the redistribution lower pads 182P2.

The ends of the bonding wires 130 may be attached to the first chip pads 120 of the first semiconductor chips 100, and the other ends of the bonding wires 130 may be attached to the redistribution upper pads 182P1.

The bonding wires 130 may mostly have the first diameters DW. For example, each bonding wire 130 may have the first diameter DW having a constant value on other portions of the bonding wire 130 except for the ball bond 130B. The first diameter DW may be between about 0.5 mil and about 1 mil.

In some embodiments of the inventive concept, the bonding wires 130 may extend from the redistribution upper pads 182P1 in the vertical direction (the Z direction). In some embodiments of the inventive concept, the cross-sections of the other ends of the bonding wires 130 contacting the redistribution upper pads 182P1 may have circular shapes. In other words, the interfaces between the redistribution upper pads 182P1 and the bonding wires 130 may have circular shapes. For example, the cross-sections of the other ends of the bonding wires 130 contacting the redistribution upper pads 182P1 may have circular shapes having the first diameter DW.

In other embodiments of the inventive concept, when the bonding wires 130a, which extend from the redistribution upper pads 182P1 in a different direction from the vertical direction (the Z direction), for example, at a gradient less than or equal to 5 degrees from the vertical direction (the Z direction), are formed instead of the bonding wires 130, the cross-sections of the other ends of the bonding wires 130a contacting the redistribution upper pads 182P1 may have oval shapes. The short axis of the cross-section of the other end of the bonding wire 130a may have the first diameter DW, and the long axis of the cross-section of the other end of the bonding wire 130a may have the second diameter DWa that is greater than the first diameter DW. The second diameter DWa may be greater than the first diameter DW by as much as about 5% or less. For example, the cross-section of the other end of the bonding wire 130a may have an oval shape close to a circle.

Then, as illustrated in FIG. 1, the semiconductor package 1 may be formed by attaching the first chip connection terminals 190 to the redistribution lower pads 182P2.

In some embodiments of the inventive concept, the semiconductor package 1 may not include the first chip connection terminals 190, and as illustrated in FIG. 2I, the redistribution lower pads 182P2 may be exposed to the outside.

In some embodiments of the inventive concept, the first semiconductor chips 100 of FIG. 2I may be arranged to make stack structures stacked in the vertical direction (the Z direction) that are separated from each other in the horizontal direction (the X direction or the Y direction), and the molding member 170 may surround the stack structures. The redistribution layer 180 may be formed to cover the stack structures and the molding member 170 covering the stack structures. In this case, the stack structures may be separated from each other by cutting the redistribution layer 180 and the molding member 170. For example, the side surface of the molding member 170 may be aligned with the side surface of the redistribution layer 180 in the vertical direction (the Z direction) and thus may form a coplanar surface.

Referring to FIGS. 1 to 2I, in the semiconductor package 1, because the stitch bonds 130S of the bonding wires 130 and the portions adjacent thereto are removed, the bonding wires 130 connected to the redistribution upper pads 182P1 may perform a micro-pillar function. In addition, because the stitch bonds 130S of the bonding wires 130 are removed, distances between the other ends of the bonding wires 130 connected to the redistribution upper pads 182P1 may be reduced, and thus, the bandwidth provided by the semiconductor package 1 may increase.

Therefore, manufacturing costs are reduced by connecting the first semiconductor chips 100 through a wire bonding process, and a horizontal area may decrease and a high bandwidth of the semiconductor package 1 may be provided.

FIG. 3 is a cross-sectional view of a semiconductor package according to embodiments of the inventive concept. The descriptions that are the same as those provided with reference to FIGS. 1 to 2I may be omitted.

Referring to FIG. 3, a semiconductor package 1a includes the redistribution layer 180 and the first semiconductor chips 100a sequentially stacked on the redistribution layer 180. In some embodiments of the inventive concept, the first semiconductor chips 100a may be stacked on the redistribution layer 180 in units of multiples of 4. The semiconductor package 1a may be referred to as a sub-semiconductor package, and the first semiconductor chip 100a may be referred to as a semiconductor chip.

Each of the first semiconductor chips 100a may include the first semiconductor substrate 110 having the active surface and the inactive surface that are opposite to each other, the first semiconductor device 112 formed on the active surface of the first semiconductor substrate 110, and the first chip pads 120 arranged on the upper surface of the first semiconductor chip 100a. The inactive surface of the first semiconductor substrate 110 may be the lower surface of the first semiconductor chip 100a, and wiring lines, wiring vias, and an inter-wiring insulating layer surrounding the wiring lines and the wiring vias may be arranged between the active surface of the first semiconductor substrate 110 and the upper surface of the first semiconductor chip 100a.

In some embodiments of the inventive concept, the first chip pads 120 may be edge pads adjacent to edges of the upper surface of each of the first semiconductor chips 100a. For example, the first chip pads 120 may be arranged adjacent to one edge or two edges from among four edges of the upper surface of each first semiconductor chip 100a.

Each first semiconductor chip 100a may have a face-up arrangement in which the active surface of the first semiconductor substrate 110 faces upwards. Each first semiconductor chip 100a may have a configuration in which the inactive surface of the first semiconductor substrate 110 faces the redistribution layer 180, and the first semiconductor chips 100a may be sequentially stacked on the redistribution layer 180.

In some embodiments of the inventive concept, the first semiconductor device 112 may be a memory semiconductor device, and the first semiconductor chip 100a may be a memory semiconductor chip. For example, the first semiconductor device 112 may be a DRAM device, and the first semiconductor chip 100a may be a DRAM chip.

The first semiconductor chips 100a may each include a lower semiconductor chip 100La, which is lowermost, in other words, the closest to the redistribution layer 180, and at least one upper semiconductor chip 100Ua stacked on the lower semiconductor chip 100La. The at least one upper semiconductor chip 100Ua may have a first thickness T1, and the lower semiconductor chip 100La may have a second thickness T2 that is less than the first thickness T1. In some embodiments of the inventive concept, the first thickness T1 may be greater than the second thickness T2 by as much as about 10 μm to about 70 μm. For example, the first thickness T1 may be between about 80 μm and about 150 μm, and the second thickness T2 may be between about 50 μm and about 80 μm.

Except that the lower semiconductor chip 100La has the second thickness T2 that is less than the first thickness T1 of the at least one upper semiconductor chip 100Ua, the lower semiconductor chip 100La and the at least one upper semiconductor chip 100Ua may be substantially the same semiconductor chip. For example, the lower semiconductor chip 100La may be formed by removing, from the upper semiconductor chip 100Ua, a portion of the first semiconductor substrate 110 adjacent to the inactive surface of the first semiconductor substrate 110. The lower semiconductor chip 100La may be referred to as the first semiconductor chip 100a that is lowermost among the first semiconductor chips 100a. The lower semiconductor chip 100La and the at least one upper semiconductor chip 100Ua may have the same horizontal width and horizontal area.

The lower semiconductor chip 100La may be attached onto the redistribution layer 180 as the lower surface of the lower semiconductor chip 100La. In this case, the inactive surface of the lower semiconductor chip 100La directly contacts the upper surface of the redistribution layer 180. The at least one upper semiconductor chip 100Ua may include a die bonding film 152 attached to the lower surface of the at least one upper semiconductor chip 100Ua and may be attached to a structure under the at least one upper semiconductor chip 100Ua. For example, when the first semiconductor chips 100a include one lower semiconductor chip 100La and a plurality of upper semiconductor chips 100Ua, the upper semiconductor chip 100Ua, which is lowermost among the upper semiconductor chips 100Ua, may have the die bonding films 152 between it and the lower semiconductor chip 100La to which it is attached. Other upper semiconductor chips 100Ua may have the die bonding films 152 between them and other upper semiconductor chips 100Ua to which they are attached.

In other words, the first semiconductor chips 100a may have the die bonding films 152 therebetween and may be sequentially stacked, and the first semiconductor chip 100a, which is lowermost among the first semiconductor chips 100a, may be directly attached onto the redistribution layer 180.

In some embodiments of the inventive concept, a thickness of the die bonding film 152 may be less than that of the die bonding film 150 of FIG. 1. For example, the thickness of the die bonding film 152 may be the same as that of the lower die bonding film 150L of FIG. 2C.

The first semiconductor chips 100a may be sequentially stacked on the redistribution layer 180 in the vertical direction (the Z direction). For example, the first semiconductor chips 100a may form a stepwise shape on the redistribution layer 180 and may be sequentially stacked in the vertical direction (the Z direction). The first semiconductor chips 100a may be shifted in the horizontal direction (the X direction or the X direction and the Y direction) and may be stacked in the vertical direction (the Z direction). At least one upper semiconductor chip 100Ua may be overhung from the lower semiconductor chip 100La disposed under the at least one upper semiconductor chip 100Ua or another upper semiconductor chip 100Ua. For example, portions of the upper surface, on which the first chip pads 120 of the first semiconductor chips 100a are disposed, may not overlap each other in the vertical direction (the Z direction). In this case, the first chip pads 120 may be exposed to be covered by the molding member 170.

The ends of the bonding wires 130 may be attached to the first chip pads 120 of the first semiconductor chips 100a, and the other ends of the bonding wires 130 may be attached to the redistribution upper pads 182P1. The ball bonds 130B adjacent to the ends of the bonding wires 130 may not be buried in the die bonding film 152. For example, the ball bonds 130B may be exposed to be covered by the molding member 170.

Because the bonding wires 130 are substantially the same as the bonding wires 130 of FIG. 1, the detailed descriptions thereof are omitted. In addition, the semiconductor package 1a may include the bonding wires 130a of FIG. 1 instead of the bonding wires 130.

The semiconductor package 1a may include, on the redistribution layer 180, the molding member 170 covering the upper surface of the redistribution layer 180 and surrounding the first semiconductor chips 100a and the bonding wires 130. The molding member 170 may surround all of the bonding wires 130.

The lower surface of the molding member 170, the cross-sections of the other ends of the bonding wires 130 contacting the redistribution upper pads 182P1, and the lower surface of the lower semiconductor chip 100La, which is the lowermost among the first semiconductor chips 100a, may be at the same vertical level. For example, the lower surface of the molding member 170, the cross-sections of the other ends of the bonding wires 130 contacting the redistribution upper pads 182P1, and the lower surface of the lower semiconductor chip 100La, which is the lowermost among the first semiconductor chips 100a, may form a coplanar surface.

Manufacturing costs are reduced by connecting the first semiconductor chips 100a through a wire bonding process, and a horizontal area may decrease and a high bandwidth of the semiconductor package 1a may be provided.

Figure 4:
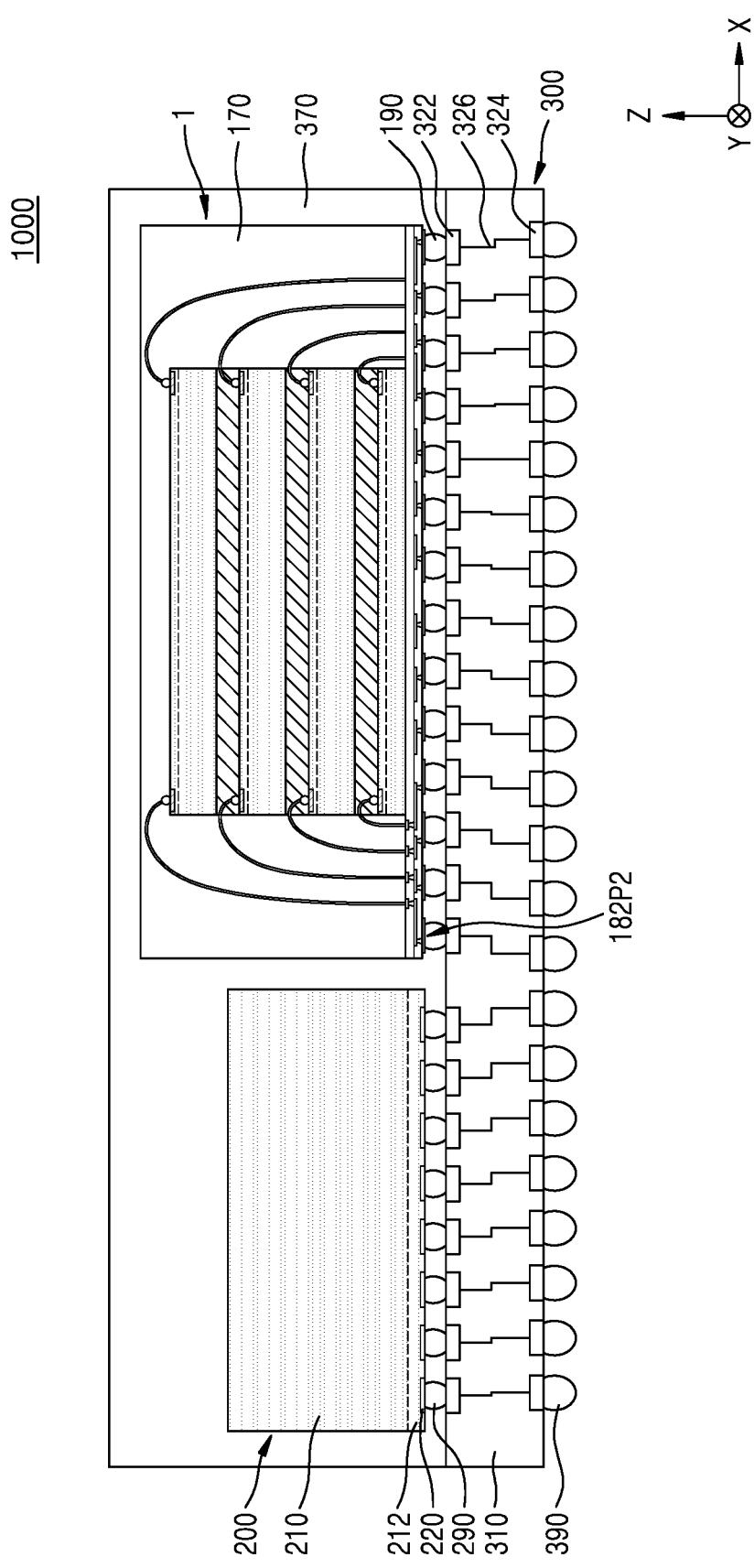
FIG. 4 is a cross-sectional view of a semiconductor package according to embodiments of the inventive concept.

FIG. 4 is a cross-sectional view of a semiconductor package according to embodiments of the inventive concept.

Referring to FIGS. 1 and 4, a semiconductor package 1000 may include a package board 300 and a sub-semiconductor package 1 and a second semiconductor chip 200 that are separated from and adhere to the package board 300 in the horizontal direction (the X direction and/or the Y direction). The semiconductor package 1000 may further include, on the package board 300, a second molding member 370 surrounding the sub-semiconductor package 1 and the second semiconductor chip 200. The sub-semiconductor package 1 may be the semiconductor package 1 described with reference to FIGS. 1 to 2I, and thus, detailed descriptions thereof are omitted.

The second semiconductor chip 200 may include a second semiconductor substrate 210 having an active surface on which a second semiconductor device 212 is formed, and second chip pads 220 arranged on the active surface of the second semiconductor substrate 210. The second semiconductor substrate 210 and the second semiconductor device 212 may be substantially similar to the first semiconductor substrate 110 and the first semiconductor device 112 of FIG. 1, and thus, the detailed descriptions thereof are omitted.

In some embodiments of the inventive concept, the second semiconductor chip 200 may be, for example, a central processing unit (CPU) chip, a graphics processing unit (GPU) chip, or an application processor (AP) chip.

The second molding member 370 may contact the first semiconductor chips 100 included in the sub-semiconductor package 1, and the first molding member 170 surrounding the bonding wires 130. The second molding member 370 may include, for example, an epoxy molding compound (EMC). An interface may be formed between the first molding member 170 and the second molding member 370.

The package board 300 may include a base board layer 310, board upper pads 322, and board lower pads 324 that are respectively arranged on an upper surface and a lower surface of the base board layer 310. In some embodiments of the inventive concept, the package board 300 may be a printed circuit-board. For example, the package board 300 may be a multi-layer Printed Circuit Board.

The base board layer 310 may include at least one material selected from phenol resin, epoxy resin, and PI. The base board layer 310 may include, for example, at least one material selected from Frame Retardant 4 (FR4), tetrafunctional epoxy, polyphenylene ether, epoxy/polyphenylene oxide, bismaleimide triazine (BT), thermount, cyanate ester, PI, and a liquid crystal polymer.

The board upper pads 322 and the board lower pads 324 may be electrically connected to each other through internal wires 326. In some embodiments of the inventive concept, the board upper pads 322, the board lower pads 324, and the internal wires 326 may each include Cu. For example, the board upper pads 322, the board lower pads 324, and the internal wires 326 may each include electrolytically deposited (ED) copper foil, rolled-annealed (RA) copper foil, ultra-thin copper foil, sputtered copper, copper alloys, or the like.

In some embodiments of the inventive concept, a solder resist layer exposing the board upper pads 322 and the board lower pads 324 may be formed on the upper surface and the lower surface of the base board layer 310, respectively.

The first chip connection terminals 190 may be attached onto some of the board upper pads 322, and second chip connection terminals 290 may be attached onto the others of the board upper pads 322. The second chip connection terminals 290 may be provided between the second semiconductor chip 200 and the package board 300. The sub-semiconductor package 1 may be electrically connected to the package board 300 through the first chip connection terminal 190, and the second semiconductor chip 200 may be electrically connected to the package board 300 through the second chip connection terminals 290. The sub-semiconductor package 1 and the second semiconductor chip 200 may each be attached according to a flip chip bonding method. The first chip connection terminals 190 may be arranged between some of the board upper pads 322 and the redistribution lower pads 182P2 and may electrically connect the same. The second chip connection terminals 290 may be arranged between others of the board upper pads 322 and the second chip pads 220 and may electrically connect the same.

System connection terminals 390 may be attached to the board lower pads 324. The system connection terminals 390 may be, for example, solder balls.

Figure 5:
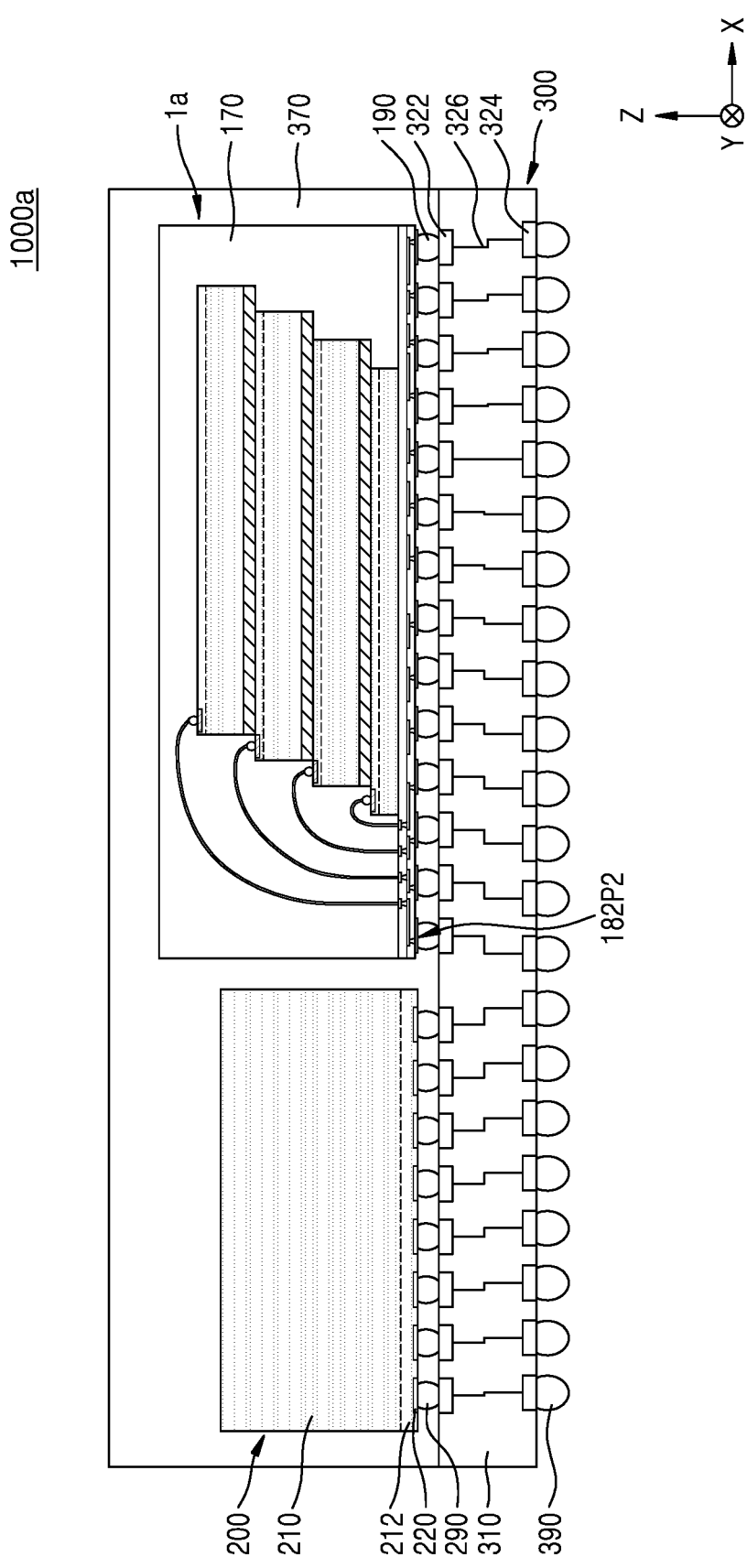
FIG. 5 is a cross-sectional view of a semiconductor package according to embodiments of the inventive concept.

FIG. 5 is a cross-sectional view of a semiconductor package according to embodiments of the inventive concept. Descriptions that are the same as those provided with reference to FIG. 4 may be omitted.

Referring to FIGS. 3 and 5, a semiconductor package 1000a may include the package board 300 and a sub-semiconductor package 1a and the second semiconductor chip 200 that are separated from each other and adhere to the package board 300 in the horizontal direction (the X direction and/or the Y direction). The semiconductor package 1000a may further include a second molding member 370 surrounding the sub-semiconductor package 1a and the second semiconductor chip 200 on the package board 300. The sub-semiconductor package 1a may be the semiconductor package 1a described with reference to FIG. 3, and thus, detailed descriptions thereof are omitted.

The second semiconductor chip 200 may include the second semiconductor substrate 210 having the active surface on which the second semiconductor device 212 is formed, and the second chip pads 220 arranged on the active surface of the second semiconductor substrate 210. In some embodiments of the inventive concept, the second semiconductor chip 200 may be, for example, a CPU chip, a GPU chip, or an AP chip.

The second molding member 370 may contact the first molding member 170 surrounding the first semiconductor chips 100a included in the sub-semiconductor package 1a and the bonding wires 130. An interface may be formed between the first molding member 170 and the second molding member 370.

The package board 300 may include the base board layer 310, and the board upper pads 322 and the board lower pads 324 that are respectively arranged on the upper surface and the lower surface of the base board layer 310.

First chip connection terminals 190 may be connected to the board upper pads 322, and package connection terminals 390 may be connected to the board lower pads 324. The first chip connection terminals 190 may electrically connect redistribution lower pads 182P2 to the board upper pads 322. The package connection terminals 390 connected to the board lower pads 324 may connect the semiconductor package 1000a to the outside.

The first chip connection terminals 190 may be attached onto some of the board upper pads 322, and the second chip connection terminals 290 may be attached onto others of the board upper pads 322. The sub-semiconductor package 1a may be electrically connected to the package board 300 through the first chip connection terminals 190, and the second semiconductor chip 200 may be electrically connected to the package board 300 through the second chip connection terminals 290. The first chip connection terminals 190 may be arranged between some of the board upper pads 322 and the redistribution lower pads 182P2 and may electrically connect the same. The second chip connection terminals 290 may be arranged between others of the board upper pads 322 and the second chip pads 220 and may electrically the same.

System connection terminals 390 may be attached to the board lower pads 324. The system connection terminals 390 may be, for example, solder balls.

Figure 6:
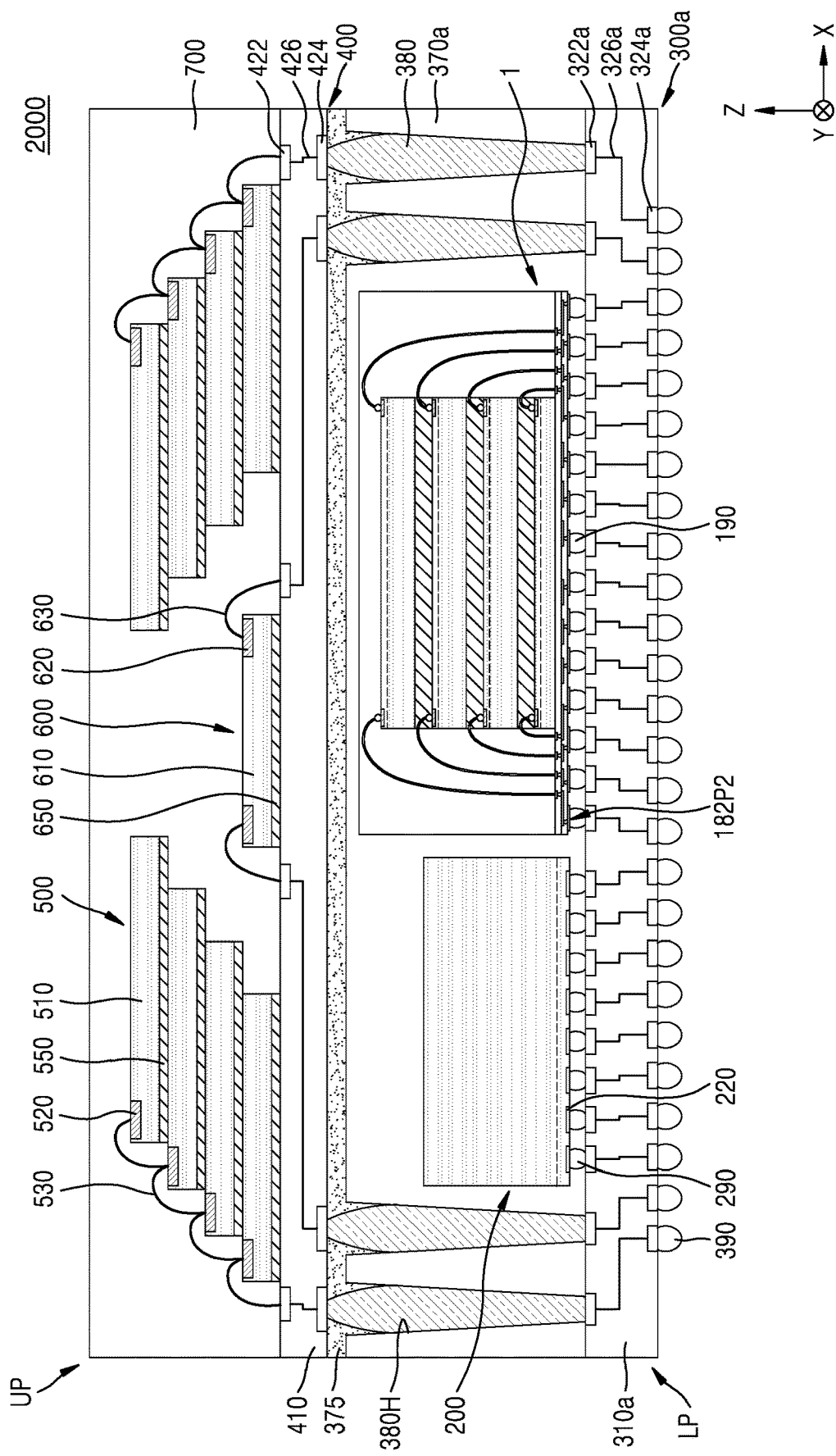
FIG. 6 is a cross-sectional view of a semiconductor package of a package on package (PoP) type, according to embodiments of the inventive concept.

FIG. 6 is a cross-sectional view of a semiconductor package of a package on package (PoP) type, according to embodiments of the inventive concept.

Referring to FIGS. 1 and 6, a semiconductor package 2000 may be a semiconductor package of a PoP type in which an upper package UP is attached to a lower package LP.

The lower package LP may include: a lower package board 300a; the sub-semiconductor package 1 and the second semiconductor chip 200 that are separated from each other and attached to the lower package board 300a in the horizontal direction (the X direction and/or the Y direction); and a second molding member 370a surrounding the sub-semiconductor package 1 and the second semiconductor chip 200 on the lower package board 300a. The sub-semiconductor package 1 may be the semiconductor package 1 described with reference to FIGS. 1 to 2I, and thus, detailed descriptions thereof are omitted.

The lower package board 300a may include a lower base board layer 310a, and lower board upper pads 322a and lower board lower pads 324a that are respectively arranged on an upper surface and a lower surface of the lower base board layer 310a. The lower package board 300a is substantially similar to the package board 300 of FIG. 4, and thus, detailed descriptions thereof are omitted.

The lower board upper pads 322a and the lower board lower pads 324a may be electrically connected to each other through lower internal wires 326a.

The first chip connection terminals 190 may be attached onto some of the lower board upper pads 322a, and the second chip connection terminals 290 may be attached onto others of the lower board upper pads 322a. Others of the lower board upper pads 322a may be electrically connected to the upper package UP. The sub-semiconductor package 1 may be electrically connected to the lower package board 300a through the first chip connection terminals 190, and the second semiconductor chip 200 may be electrically connected to the lower package board 300a through the second chip connection terminals 290. The first chip connection terminals 190 may be arranged between some of the lower board upper pads 322a and the redistribution lower pads 182P2 and may electrically connect the same. The second chip connection terminals 290 may be arranged between others of the lower board upper pads 322a and the second chip pads 220 and may electrically connect the same. The system connection terminals 390 may be attached to the lower board lower pads 324a.

The second molding member 370a may have through holes 380H extending from an upper surface of the second molding member 370a to a lower surface thereof. Through lower surfaces of the through holes 380H, others of the lower board upper pads 322a may be exposed. In some embodiments of the inventive concept, the through holes 380H may have tapered shapes in which the horizontal width decreases from the upper surface of the second molding member 370a to the lower surface thereof. For example, the horizontal width of a through hole 380H may be smallest at an area adjacent to the lower surface of the second molding member 370a.

Through vias 380 may be arranged in the through holes 380H. Lower surfaces of the through vias 380 may contact others of the lower board upper pads 322a. In some embodiments of the inventive concept, the through vias 380 may be formed by vertically stacking solder balls. In other embodiments of the inventive concept, the through vias 380 may be conductive posts including metal, for example, Cu posts.

The upper package UP may include an upper package board 400, at least one upper chip 500 and 600 attached to the upper package board 400, and a third molding member 700 surrounding the at least one upper chip 500 and 600. The at least one upper chip 500 and 600 may include third semiconductor chips 500 and/or at least one fourth semiconductor chip 600.

The upper package board 400 may include an upper base board layer 410 and upper board upper pads 422 and upper board lower pads 424 that are respectively arranged on an upper surface and a lower surface of the upper base board layer 410. The upper board upper pads 422 and the upper board lower pads 424 may be electrically connected to each other through upper internal wires 426. The upper package board 400 is substantially similar to the lower package board 300a, and thus, detailed descriptions thereof are omitted.

The upper board lower pads 424 may be connected to the through vias 380. For example, the upper board lower pads 424 may be in direct contact with the through vias 380. The upper surfaces of the through vias 380 may contact the upper board lower pads 424, and the lower surfaces of the through vias 380 may contact others of the lower board upper pads 322a.

In some embodiments of the inventive concept, the semiconductor package 200 may further include a charging member 375 filling a gap between the lower package LP and the upper package UP. The charging member 375 may fill the gap between the second molding member 370a and the upper package board 400. In some embodiments of the inventive concept, when the through vias 380 do not completely fill the through holes 380H, the charging member 375 may fill remaining spaces of the through holes 380H that are not filled by the through vias 380.

In some embodiments of the inventive concept, the upper package UP may include the third semiconductor chips 500. In other embodiments of the inventive concept, the upper package UP may include at least one fourth semiconductor chip 600. In other embodiments of the inventive concept, the upper package UP may include the third semiconductor chips 500 and the at least one fourth semiconductor chip 600.

The third semiconductor chip 500 may include a third semiconductor substrate 510 and third chip pads 520 arranged on an active surface of the third semiconductor substrate 510. The third semiconductor substrate 510 and the third chip pad 520 are substantially similar to the first semiconductor substrate 110 and the first chip pad 120 of FIG. 3, and thus, detailed descriptions thereof are omitted.

In some embodiments of the inventive concept, the third semiconductor chip 500 may be a memory semiconductor chip. The third semiconductor chip 500 may be, for example, a non-volatile memory semiconductor chip such as flash memory, Phase-change Random Access Memory (PRAM), Magnetoresistive Random Access Memory (MRAM), Ferroelectric Random Access Memory (FeRAM), or Resistive Random Access Memory (RRAM). In some embodiments of the inventive concept, the third semiconductor chip 500 may be a NAND flash memory.

In some embodiments of the inventive concept, the third semiconductor chips 500 may be sequentially stacked on the upper package board 400 in the vertical direction (the Z direction). For example, the third semiconductor chips 500 may be sequentially stacked on the upper package board 400 in the vertical direction (the Z direction) after first upper die bonding films 550 are attached to lower surfaces of the third semiconductor chips 500. For example, a first upper die bonding film 550 may be provided between a lowermost third semiconductor chip 500 and the upper base board layer 410, and another first upper die bonding film 550 may be provided between the lowermost third semiconductor chip 500 and a third semiconductor chip 500 directly above the lowermost third semiconductor chip 500. For example, the third semiconductor chips 500 may form a stepwise shape on the upper package board 400 and may be sequentially stacked on the upper package board 400 in the vertical direction (the Z direction). The third semiconductor chips 500 may be shifted in the horizontal direction (the X direction or the X direction and the Y direction) and stacked in the vertical direction (the Z direction). For example, portions of upper surfaces, on which third chip pads 520 of the third semiconductor chips 500 are arranged, may not overlap each other in the vertical direction (the Z direction).

First upper bonding wires 530 may sequentially connect corresponding third chip pads 520 from among the third chip pads 520 of the third semiconductor chips 500 to corresponding upper board upper pads 422 from among the upper board upper pads 422.

The fourth semiconductor chip 600 may include a fourth semiconductor substrate 610, and fourth chip pads 620 arranged on an active surface of the fourth semiconductor substrate 610. The fourth semiconductor substrate 610 and the fourth chip pad 620 are substantially similar to the third semiconductor substrate 510 and the third chip pad 520, and thus, detailed descriptions thereof are omitted.

In some embodiments of the inventive concept, at least one fourth semiconductor chip 600 may be a controller semiconductor chip for controlling the third semiconductor chips 500. The at least one fourth semiconductor chip 600 may be attached to the upper package board 400 after a second upper die bonding film 650 is attached to a lower surface of the at least one fourth semiconductor chip 600.

The second upper bonding wires 630 may connect corresponding fourth chip pads 620 from among the fourth chip pads 620 of the at least one fourth semiconductor chip 600 to corresponding upper board upper pads 422 from among the upper board upper pads 422.

The third molding member 700 may surround the third semiconductor chips 500 and/or at least one fourth semiconductor chip 600, and the first upper bonding wires 530 and/or the second upper bonding wires 630. The third molding member 700 may include, for example, an EMC.

Figure 7:
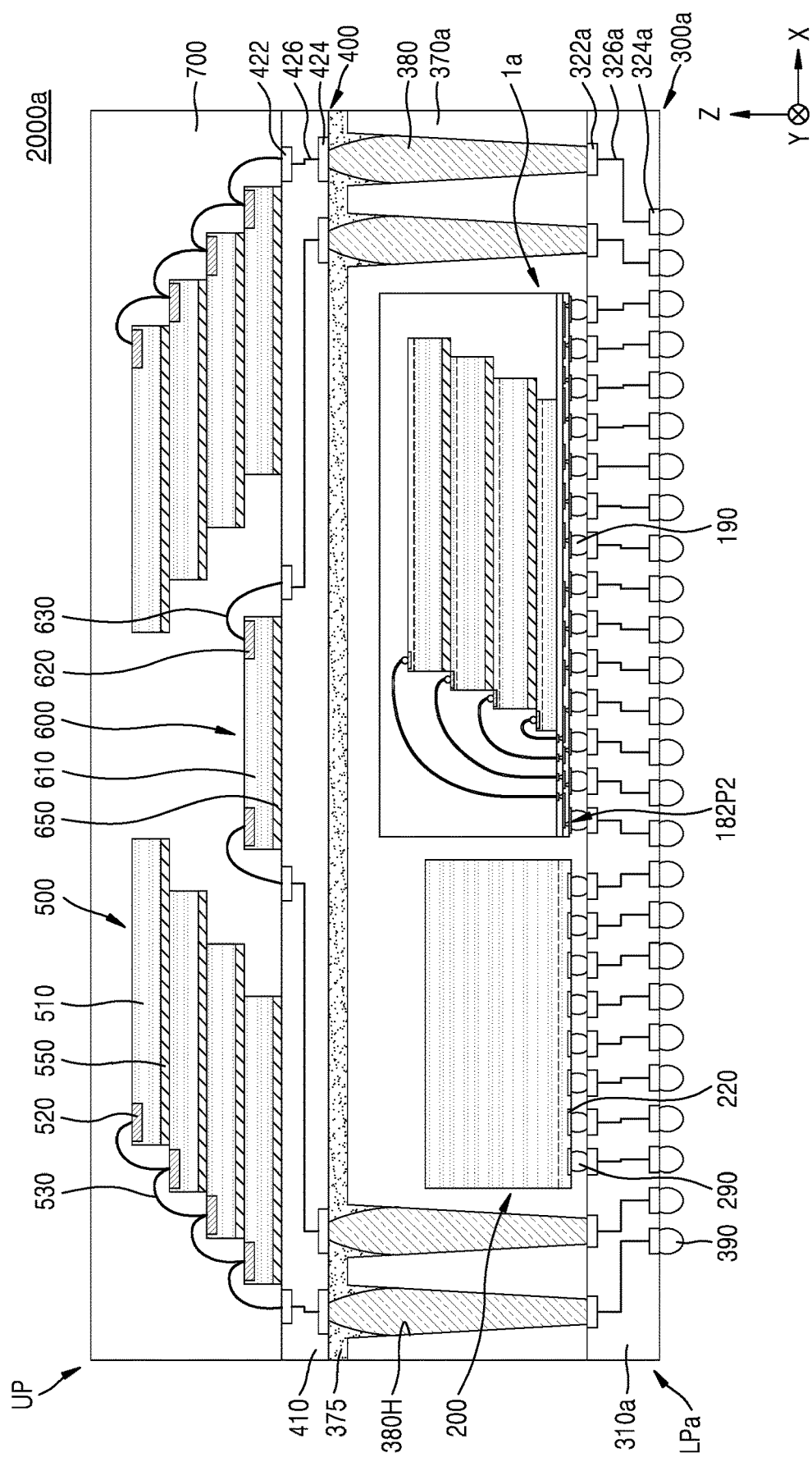
FIG. 7 is a cross-sectional view of a semiconductor package of a PoP type, according to embodiments of the inventive concept.

FIG. 7 is a cross-sectional view of a semiconductor package of a PoP type, according to embodiments of the inventive concept. Descriptions that are the same as those provided with reference to FIG. 6 may be omitted.

Referring to FIGS. 1, 6 and 7, a semiconductor package 2000a may be a semiconductor package of a PoP type in which the upper package UP is attached to a lower package LPa.

The lower package LPa may include a lower package board 300a, a sub-semiconductor package 1a and the second semiconductor chip 200 that are separated from each other and adhered to the lower package board 300a in the horizontal direction (the X direction and/or the Y direction), and the second molding member 370a surrounding, on the lower package board 300a, the sub-semiconductor package 1a and the second semiconductor chip 200. The sub-semiconductor package 1a may be the semiconductor package 1a of FIG. 3, and thus, detailed descriptions thereof are omitted.

The lower package board 300a may include a base board layer 310a, lower board upper pads 322a and lower board lower pads 324a that are respectively arranged on an upper surface and a lower surface of the base board layer 310a. The lower board upper pads 322a and the lower board lower pads 324a may be electrically connected to each other through lower internal wires 326a.

The first chip connection terminals 190 may be attached to some of the lower board upper pads 322a, and the second chip connection terminals 290 may be attached to others of the lower board upper pads 322a. Others of the lower board upper pads 322a may be electrically connected to the upper package UP. The sub-semiconductor package 1a may be electrically connected to the lower package board 300a through the first chip connection terminals 190, and the second semiconductor chip 200 may be electrically connected to the lower package board 300a through the second chip connection terminals 290. The first chip connection terminals 190 may be arranged between some of the lower board upper pads 322a and the redistribution lower pads 182P2 and may electrically connect the same. The second chip connection terminals 290 may be arranged between others of the lower board upper pads 322a and the second chip pads 220 and may electrically connect the same. The system connection terminals 390 may be attached to the lower board lower pads 324*a*.

The second molding member 370*a* may include the through holes 380H extending from the upper surface of the second molding member 370*a* to the lower surface thereof. The through vias 380 may be arranged in the through holes 380H.

The upper package UP may include the upper package board 400, the at least one upper chip 500 and 600 attached to the upper package board 400, and the third molding member 700 surrounding the at least one upper chip 500 and 600. The at least one upper chip 500 and 600 may include third semiconductor chips 500 and/or at least one fourth semiconductor chip 600.

The upper package board 400 may include the upper base board layer 410 and the upper board upper pads 422 and the upper board lower pads 424 that are respectively arranged on the upper surface and the lower surface of the upper base board layer 410. The upper board upper pads 422 and the upper board lower pads 424 may be electrically connected to each other through the upper internal wires 426.

The upper board lower pads 424 may be connected to the through vias 380. The upper surfaces of the through vias 380 may contact the through vias 380, and the lower surfaces of the through vias 380 may contact others of the lower board upper pads 322*a*.

In some embodiments of the inventive concept, the semiconductor package 2000*a* may further include the charging member 375 filling a gap between the lower package LPa and the upper package UP. The charging member 375 may fill the gap between the second molding member 370*a* and the upper package board 400.

In some embodiments of the inventive concept, the upper package UP may include the third semiconductor chips 500. In other embodiments of the inventive concept, the upper package UP may include at least one fourth semiconductor chip 600. In other embodiments of the inventive concept, the upper package UP may include the third semiconductor chips 500 and the at least one fourth semiconductor chip 600.

While the inventive concept has been particularly shown and described with reference to embodiments thereof, it will be understood that various changes in form and details may be made thereto without departing from the spirit and scope of the inventive concept as set forth in the following claims.

What is claimed is:

1. A semiconductor package, comprising:
   a redistribution layer comprising a plurality of redistribution lines, a plurality of redistribution vias connected to some of the plurality of redistribution lines, and a redistribution insulating layer surrounding some of the plurality of redistribution lines and the plurality of redistribution vias;
   a plurality of semiconductor chips comprising at least one upper semiconductor chip disposed on a lowermost semiconductor chip of the semiconductor chips, wherein the at least one upper semiconductor chip has a thickness that is greater than a thickness of the lowermost semiconductor chip;
   a plurality of bonding wires each having a first end and a second end, wherein the plurality of bonding wires connect the plurality of semiconductor chips to the redistribution layer, wherein the first end of each of the plurality of bonding wires is connected to a respective chip pad of the plurality of semiconductor chips and the second end of each of the plurality of bonding wires is connected to a respective one of the plurality of redistribution lines; and
   a molding member surrounding, on the redistribution layer, the plurality of semiconductor chips and the plurality of bonding wires.

2. The semiconductor package of claim 1, wherein a lower surface of the lowermost semiconductor chip directly contacts an upper surface of the redistribution layer.

3. The semiconductor package of claim 2, wherein the at least one upper semiconductor chip comprises a die bonding film attached to a lower surface of the at least one upper semiconductor chip and is stacked on the lowermost semiconductor chip.

4. The semiconductor package of claim 1, wherein cross-sections of second ends of the plurality of bonding wires connected to the plurality of redistribution lines, a lower surface of the molding member, and a lower surface of the lowermost semiconductor chip form a coplanar surface.

5. The semiconductor package of claim 1, wherein an inactive surface of each of the plurality of semiconductor chips faces the redistribution layer.

6. The semiconductor package of claim 1, wherein edges of each of the plurality of semiconductor chips are aligned in a vertical direction.

7. The semiconductor package of claim 1, wherein the plurality of semiconductor chips are stacked to form a stepwise shape.

8. The semiconductor package of claim 1, wherein cross-sections of the second ends of the plurality of bonding wires connected to the plurality of redistribution lines each have a circular shape.

9. The semiconductor package of claim 8, wherein each of the plurality of bonding wires has a ball bond on its first end and is attached to a corresponding chip pad of the plurality of semiconductor chips, and
   each of the plurality of bonding wires has a first diameter near a central portion and a second diameter near the ball bonds to which it is connected.

10. A semiconductor package, comprising:
    a package board;
    a sub-semiconductor package and a second semiconductor chip that are disposed on the package board and separated from each other in a horizontal direction, wherein the sub-semiconductor package comprises a plurality of first semiconductor chips and a first molding member surrounding the plurality of first semiconductor chips; and
    a second molding member surrounding, on the package board, the sub-semiconductor package and the second semiconductor chip,
    wherein the sub-semiconductor package further comprises:
    a redistribution layer comprising a plurality of redistribution lines comprising a redistribution upper pad and a redistribution lower pad, and a redistribution insulating layer surrounding at least a portion of the plurality of redistribution lines;
    the plurality of first semiconductor chips comprising a lowermost semiconductor chip that has a lower surface directly contacting an upper surface of the redistribution layer, and at least one upper semiconductor chip stacked on the lowermost semiconductor chip;
    a plurality of bonding wires connecting a chip pad of the plurality of first semiconductor chips to the redistribution upper pad; and the first molding member surrounding, on the redistribution layer, the plurality of first semiconductor chips and the plurality of bonding wires and contacting the second molding member.

11. The semiconductor package of claim 10, wherein each of the sub-semiconductor package and the second semiconductor chip are attached to the package board according to a flip chip bonding method.

12. The semiconductor package of claim 10, wherein an inactive surface of each of the plurality of first semiconductor chips faces the redistribution layer.

13. The semiconductor package of claim 10, wherein the at least one upper semiconductor chip has a die bonding film attached to a lower surface of the at least one upper semiconductor chip and is stacked on the lowermost semiconductor chip.

14. The semiconductor package of claim 10, wherein the at least one upper semiconductor chip has a first thickness, and the lowermost semiconductor chip has a second thickness that is less than the first thickness.

15. The semiconductor package of claim 10, wherein a side surface of the redistribution layer is aligned with a side surface of the first molding member in a vertical direction.

16. The semiconductor package of claim 10, wherein each of the plurality of first semiconductor chips comprises a dynamic random access memory (DRAM) chip, the second semiconductor chip comprises a central processing unit chip, a graphics processing unit chip, or an application processor chip.

17. The semiconductor package of claim 10, wherein a cross-section of each of the plurality of bonding wires contacting the redistribution upper pad and having a circular shape, a lower surface of the first molding member, and a lower surface of the lower semiconductor chip form a coplanar surface.

18. A package-on-package (PoP) semiconductor package, comprising:
a lower package comprising: a lower package board; a sub-semiconductor package and a second semiconductor chip that are separated from each other on the package board in a horizontal direction, are attached to the lower package board according to a flip chip bonding method, wherein the sub-semiconductor package comprises a plurality of first semiconductor chips and a first molding member surrounding the plurality of first semiconductor chips; a second molding member surrounding the sub-semiconductor package and the second semiconductor chip on the package board; and a through via having a lower surface connected to the lower package board by penetrating the second molding member; and
an upper package comprising: an upper package board attached to the lower package and connected to an upper surface of the through via; and at least one upper chip attached to the upper package board,
wherein the sub-semiconductor package further comprises: a redistribution layer comprising a plurality of redistribution lines comprising a redistribution upper pad and a redistribution lower pad, and a redistribution insulating layer surrounding a portion of the plurality of redistribution lines; the first semiconductor chips comprising a chip pad on an active surface; a plurality of bonding wires connecting the chip pad of the plurality of first semiconductor chips to the redistribution upper pad; and the first molding member surrounding the plurality of first semiconductor chips and the plurality of bonding wires on the redistribution layer, and
a cross-section of the plurality of bonding wires contacting the redistribution upper pad, a lower surface of the first molding member, and a lower surface of a lower first semiconductor chip, which is lowermost among the plurality of first semiconductor chips, form a coplanar surface.

19. The PoP package of claim 18, wherein the lower surface of the lower first semiconductor chip directly contacts an upper surface of the redistribution layer, and
others of the plurality of first semiconductor chips have die bonding films attached to lower surfaces thereof and are stacked on the lower first semiconductor chip.

20. The PoP package of claim 18, wherein thicknesses of the others of the plurality of first semiconductor chips are greater than a thickness of the lower first semiconductor chip by about 10 μm to about 70 μm.

* * * * *